United States Patent
Tomita

(10) Patent No.: US 6,667,933 B2
(45) Date of Patent: Dec. 23, 2003

(54) SEMICONDUCTOR MEMORY AND METHOD OF OPERATING THE SAME

(75) Inventor: Hiroyoshi Tomita, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 09/970,657

(22) Filed: Oct. 5, 2001

(65) Prior Publication Data

US 2002/0041536 A1 Apr. 11, 2002

(30) Foreign Application Priority Data

Oct. 5, 2000 (JP) ........................................ 2000-306539
Aug. 24, 2001 (JP) ........................................ 2001-254830

(51) Int. Cl.⁷ ................................................. G11C 8/00
(52) U.S. Cl. ................... 365/233; 365/222; 365/230.06
(58) Field of Search ........................ 365/222, 230.03, 365/230.06, 230.08, 233

(56) References Cited

U.S. PATENT DOCUMENTS 5,959,930 A * 9/1999 Sakurai ................. 365/230.03
6,023,440 A * 2/2000 Kotani et al. .......... 365/230.03
6,088,291 A * 7/2000 Fujioka et al. ............... 365/233
6,240,039 B1 * 5/2001 Lee et al. .............. 365/230.06

* cited by examiner

*Primary Examiner*—Van Thu Nguyen
(74) *Attorney, Agent, or Firm*—Arent Fox Kintner Plotkin & Kahn, PLLC

(57) ABSTRACT

When a plurality of commands are received in succession to read/write data from/to memory cells in accordance with the combination of these commands, a word line for controlling the transfer switches of the memory cells are activated after the reception of one of the commands excluding the first command. This allows control circuits for activating the word lines to be operated at a lower frequency than heretofore, with a reduction in power consumption. Moreover, the word lines are activated based on an address signal that is supplied along with the first command as well as a part of an address signal supplied along with one of the commands excluding the first command. Consequently, the memory region to be selected by these address signals can be smaller, with a reduction in power consumption.

18 Claims, 24 Drawing Sheets

Fig. 18

SEMICONDUCTOR MEMORY AND METHOD OF OPERATING THE SAME

BACKGROUND OF THE INVENTION

1. Field of the Invention

The present invention relates to technologies for low power consumption and high speed of a semiconductor memory.

The present invention also relates to a semiconductor memory having memory cells with capacitors, and more particularly to a technology for performing refresh of the memory cells internally and automatically.

2. Description of the Related Art

Semiconductor memories such as a DRAM typically use common address terminals to receive address signals as a row address and a column address separately, and perform read, write, or other operations. For example, a 64-Mbit DRAM having an 8-bit I/O (address space; 8 Mbits) uses two bank address terminals and twelve address terminals to receive a 12-bit row address signal and a 9-bit column address signal. This DRAM, for example, receives an active command and a row address signal (upper address) in synchronization with a first clock signal, and receives a read command and a column address (lower address) in synchronization with the next clock signal. Here, all the word lines corresponding to the row address are activated to read out the data retained in the memory cells. The read data is amplified by sense amplifiers. In this example, the activation of the word lines selects one out of 16 k memory regions so that data is rewrite of 4 k memory cells. Then, the memory cells to read/write data from/to are selected by the column address signal, followed by a read operation or a write operation.

Now, a rise in the number of bits of the row address signal can reduce the size of a memory region to be selected at a time, and decrease the number of word lines to be activated simultaneously. The power consumption during read and write operations depends on the number of word lines to be activated as well as the number of sense amplifiers to be operated in accordance with the activation of the word lines. Thus, the greater the number of bits of the row address signal is, the lower the operating power consumption becomes.

For example, if the above-mentioned DRAM has two bank address terminals and thirteen address terminals to receive a 13-bit row address and an 8-bit column address, the number of word lines to be activated at a time will be cut by half, with a reduction in power consumption.

The greater number of bits of the row address signal, however, increases the number of terminals on the package, which makes the package larger in outside dimensions. As a result, the system board to mount the DRAM on comes to drop in parts mounting density. The parts mounting density can also be lowered by a rise in the number of lines on an address bus and an increase in the area of patterned wiring on the system board. The increased number of address terminals also leads to a greater chip size.

Meanwhile, a great number of DRAMs are used not only in mainframes and personal computers but also in consumer appliances. Generally, most DRAMs to be mounted on consumer appliances have only to operate at several tens of megahertz. Conventional DRAMs, however, have not been developed specifically for consumer appliances. Therefore, the consumer appliances to mount DRAMs on have had to adopt high-speed DRAMs targeted for computers. DRAMs of this type are developed for high-speed operations, and are often high in power consumption. In the fields of battery-driven consumer appliances such as cellular phones and digital cameras, DRAMs of low power consumption have been hoped for.

DRAM memory cells store information by having their capacitors charged. This requires that DRAM-mounted systems refresh memory cells at predetermined intervals to maintain the information written in the memory cells. Read and write operations to memory cells cannot be performed during refresh operations. This means the tendency of the above-mentioned systems to drop in I/O bus occupation rate. In particular, concerning DRAMs to be operated at lower frequencies which have been hoped for in the fields of consumer appliances and the like, there has been made no proposal for optimizing refresh operations thereof to improve the I/O bus occupation rate.

SUMMARY OF THE INVENTION

An object of the present invention is to reduce the power consumption of a semiconductor memory.

Another object of the present invention is to optimize the refresh operations of memory cells in a DRAM being operative at a low frequency, for the sake of improving an I/O bus occupation rate.

Still another object of the present invention is to reduce the time taken for the supply of a command to the completion of a read or write operation in the semiconductor memory being operative at a low frequency.

According to one of the aspects of the present invention, a semiconductor memory receives a plurality of commands in succession and performs a memory operation to read/write data from/to memory cells in accordance with the combination of these commands. Here, a word line for controlling transfer switches of the memory cells is activated after the reception of one of the commands except the first command. This allows a control circuit for activating the word line to be operated at a frequency lower than heretofore, which reduces the power consumption.

There is a sufficient period between the supply of the first command and the activation of the word line. Therefore, this period can be utilized to operate internal circuits without being recognized from exterior. The internal circuits include, for example, a refresh control circuit for automatically performing a refresh operation of the memory cells, and a self-test circuit for checking circuit functions.

According to another aspect of the present invention, address signals for designating the memory cells to be operated are supplied along with the commands. The word line is activated based on the address signal supplied along with the first command as well as part of the address signal supplied along with at least one of the commands except the first command. Activating the word line by using more address signals than heretofore can reduce the number of word lines to be activated simultaneously. In other words, the memory regions to be selected by these address signals become smaller. As a result, the scale of the circuits to be operated for memory operations can be decreased for a reduction in power consumption.

According to another aspect of the present invention, the word line includes a main-word line and a plurality of sub-word lines branching off from this main-word line. The sub-word lines are connected to the transfer switches of the memory cells. The main-word line corresponds to, for example, an upper address and is activated during a plurality of memory operations. The sub-word lines correspond to, for example, lower addresses and are activated upon each of the memory operations. Activating the plurality of sub-word lines in succession can operate all the memory cells that are selectable by the activated main-word line. That is, consecutive accesses typically referred to as page operations can be performed in a wider memory region.

According to another aspect of the present invention, the word line includes a main-word line and a plurality of sub-word lines branching off from this main-word line, the sub-word lines being connected to the transfer switches of the memory cells. The main-word line and the sub-word lines are activated during a plurality of memory operations. Performing page operations without inactivating the sub-word lines allows a reduction in the power consumption of a control circuit for the sub-word lines. That is, the power consumption during operations can be reduced further.

According to another aspect of the present invention, the word line includes a main-word line and a plurality of sub-word lines branching off from this main-word line, the sub-word lines being connected to the transfer switches of the memory cells. The main-word line is activated in accordance with the address signal supplied along with the first command. The sub-word lines are activated in accordance with the address signal supplied along with at least one of the commands except the first command. The pre-activation of the main-word line can reduce the period between the supply of the second command to the activation of the sub-word lines. As a result, page operations can be performed at high speed. Besides, if there is any redundancy circuit for relieving the memory cells and the like, a relief judgment can be performed at high speed. Moreover, if redundancy is given on a main-word-line basis, a relief judgment can be performed in between an active command and a rise of the main-word line so that the judging time of the redundancy circuit is included into the operating time of other circuits. That is, the operation of the redundancy circuit can be prevented from becoming critical.

According to another aspect of the present invention, a plurality of bit lines are respectively connected to the plurality of memory cells connected to the sub-word lines. A precharging circuit for setting the bit lines to a predetermined voltage releases a part of the bit lines from a precharge operation in accordance with the address signal supplied along with the first command. Thus, the release of the precharge operation at an earlier time of memory operation can reduce the time taken for the supply of the first command to the completion of a read or write operation.

According to another aspect of the present invention, a plurality of memory blocks having the memory cells are composed of a plurality of segments. The precharging circuit releases the bit lines from a precharge operation with respect to each of the segments. This can decrease the number of circuits to be operated in read and write operations, which reduces the power consumption during operation.

According to another aspect of the present invention, one of a plurality of memory blocks having the memory cells is selected in accordance with the address signal supplied along with the first command. Selecting a memory block at an earlier time of memory operation can decrease the number of circuits to start operation in response to the second and subsequent commands. As a result, the time taken for the supply of the first command to the completion of a read or write operation can be reduced. That is, it is possible to achieve a speedup while maintaining the characteristic of low power consumption.

According to another aspect of the present invention, the memory blocks are composed of a plurality of segments. A plurality of bit lines are respectively connected to the plurality of memory cells connected to the sub-word lines. A plurality of sense amplifiers are formed commonly for a pair of memory blocks, and amplify data on the bit lines within the blocks. That is, the sense amplifiers each are supplied with a single memory block. A plurality of bit line selecting switches establish connections between the bit lines of each memory block and the sense amplifiers, respectively. The bit line selecting switches are selected with respect to each of the segments, in accordance with the address signal supplied along with the first command. Therefore, the connections between the bit lines of a memory block to be operated and sense amplifiers can be established at an earlier time of memory operation. In other words, the bit lines of memory blocks not to be operated and sense amplifiers can be disconnected. As a result, the time taken for the supply of the first command to the completion of a read or write operation can be reduced.

Since the bit lines and the sense amplifiers are connected segment by segment, the number of circuits to be operated in read and write operations can be decreased for a reduction in the power consumption during operations.

According to another aspect of the present invention, a refresh operation for rewriting data retained in the volatile memory cells is performed by selecting the bit line switches in a plurality of segments at once. More segments can be operated during refresh than in read and write operations, which reduces the number of times of refresh necessary for refreshing all the memory cells. Accordingly, refresh intervals can be extended to increase the ratio of read and write operations within a predetermined period. This means an improvement in I/O bus occupation rate (data transmission rate).

According to another aspect of the present invention, a decoder generates a decoding signal for selecting one of the sub-word lines in accordance with the address signals. An activation control circuit activates the decoder in response to the second command alone. The activation control circuit will not respond to the third and subsequent commands. Accordingly, the sub-word lines selected in response to the second command are also valid for the third and subsequent commands. Among the address signals supplied along with the third and subsequent commands, address signals for selecting sub-word lines are ignored. This can surely prevent the semiconductor memory from malfunctions such as multiple selection of word lines. The decoder can be reduced in power consumption since it performs no operation in response to the third and subsequent commands.

According to another aspect of the present invention, in a refresh operation for rewriting data retained in the volatile memory cells, the main-word line and the sub-word lines are selected in accordance with the address signal corresponding to the first command. This allows a start of a refresh operation in response to the first command so that the refresh operation can be performed faster than read and write operations. Accordingly, within a predetermined period, the ratios of read and write operations can be increased to improve the I/O bus occupation rate (data transfer rate).

According to another aspect of the present invention, the semiconductor memory includes a refresh occurring circuit, a buffer, and a refresh control circuit. The refresh occurring circuit generates at predetermined intervals a refresh request for refreshing the memory cells. The buffer holds the refresh request. The refresh control circuit performs a refresh operation based on the refresh request held by the buffer when the memory operation is not in execution. This semiconductor memory has a sufficient period between the completion of the memory operation and the activation of word lines for the next memory operation. In accordance with the refresh request held by the buffer, a refresh operation can be performed in this period so that the refresh operation is performed without being recognized from exterior. That is, the refresh of the memory cells can be performed internally and automatically.

According to another aspect of the present invention, the semiconductor memory includes a plurality of buffers for alternately holding the refresh request. During page operations, no refresh operation can be performed even if refresh requests occur. For this reason, the maximum number of page operations is limited in accordance with a refresh period, or the interval at which a refresh request occur. Since refresh requests can be held as many as the buffers, it is possible to increase the maximum number of page operations.

According to another aspect of the present invention, the commands are supplied in synchronization with a clock signal. The refresh control circuit performs a refresh operation in synchronization with the clock signal which is supplied when the memory operation is not in execution. This facilitates the timing design of the circuits necessary for refresh control.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 18 is an explanatory diagram showing the uses of address signals within the SDRAM;

DESCRIPTION OF THE PREFERRED EMBODIMENTS

Hereinafter, embodiments of the present invention will be described with reference to the drawings.

Figure 1:
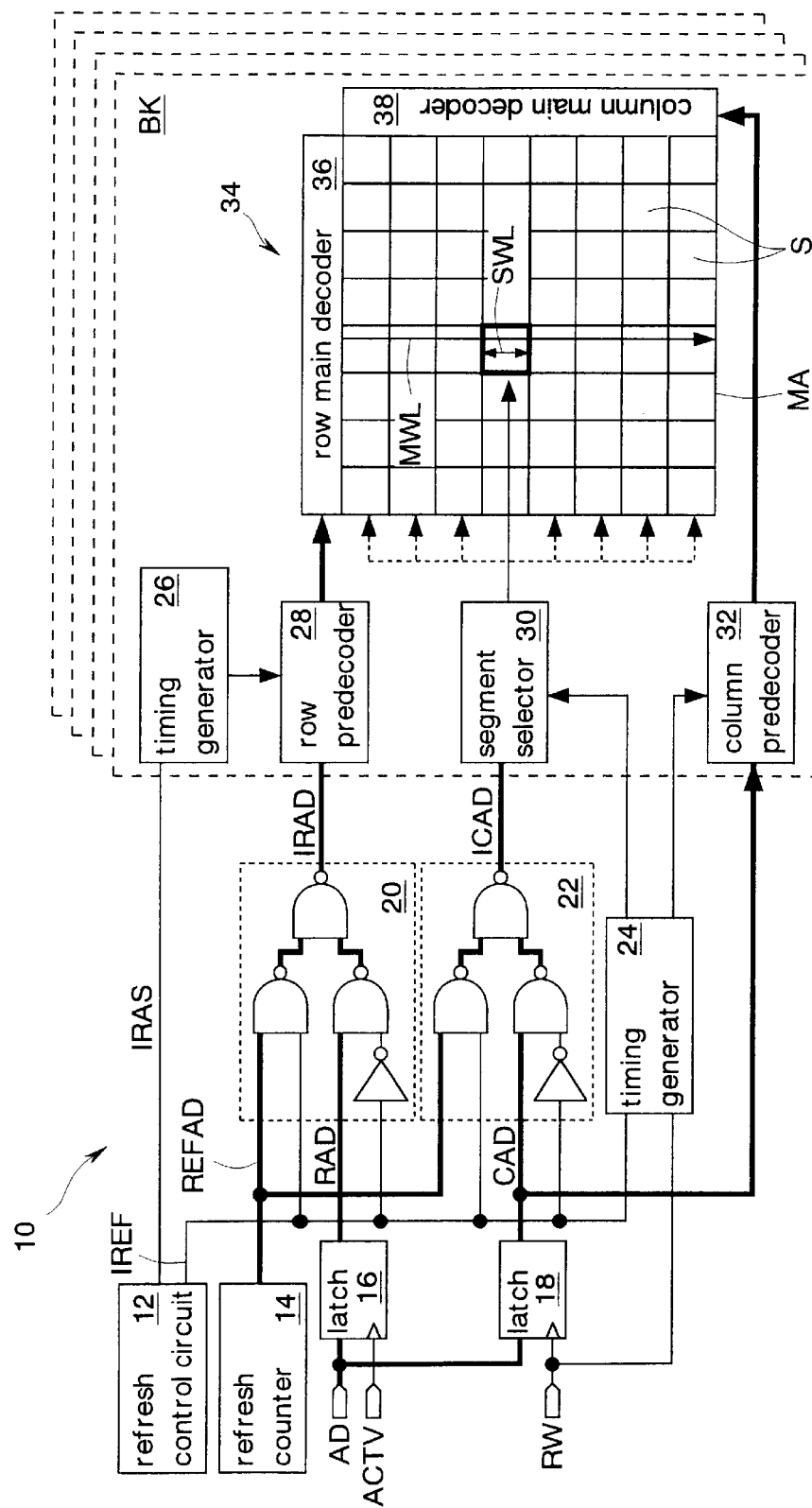
FIG. 1 is a block diagram showing a first embodiment of the present invention.

FIG. 1 shows a first embodiment of the semiconductor memory and the method of operating a semiconductor memory in the present invention.

This semiconductor memory is formed as a 64-Mbit SDRAM (Synchronous DRAM) 10 on a silicon substrate by using CMOS processes. This SDRAM 10 is designed chiefly for consumer appliances, and has a maximum clock frequency of 40 MHz (lower than or equal to a half that of the fastest SDRAMs). For the sake of excellent usability, the SDRAM 10 has the function of refreshing its memory cells internally and automatically. Consequently, users can design system boards to mount the SDRAM on without any consideration of refresh.

The SDRAM 10 has the same terminal configuration as that of ordinary 64-Mbit SDRAMs. That is, the SDRAM 10 has twelve address terminals for receiving a 12-bit row address signal and a 9-bit column address signal, two bank select terminals, and eight data input/output terminals.

As shown in FIG. 1, the SDRAM 10 has a refresh control circuit 12, a refresh counter 14, latches 16 and 18, address selectors 20 and 22, a timing generator 24, and four banks BK.

The banks BK each include a timing generator 26, a row predecoder 28, a segment selector 30, a column predecoder 32, and a memory core 34. The memory core 34 has a memory array MA which is composed of a plurality of segments S arranged vertically and horizontally. In this example, each single segment S is composed of 256 k memory cells. A row main decoder 36 and a column main decoder 38, as well as not-shown sense amplifiers, data input/output switches, and the like, are arranged around the memory array MA. The row main decoder 36 selects, through main-word lines MWL, segments S which align in the vertical direction of the diagram. The column main decoder 38 selects, through not-shown column switches and the like, segments S which align in the horizontal direction of the diagram. The main-word lines MWL each are connected to a plurality of sub-word lines SWL via switches such as transistors. The sub-word lines SWL are connected to the gates of the transfer transistors (transfer switches) in the memory cells.

The refresh control circuit 12 supplies control signals such as an internal refresh signal IREF and an internal row address strobe signal IRAS to individual circuits, thereby controlling the refresh operations of the memory cells. More specifically, a not-shown refresh occurring circuit (oscillator) generates a refresh request at regular intervals. The refresh request is temporarily held by a buffer (not shown) in the refresh control circuit 12, and output as the internal refresh signal IREF when the memory cores 34 are not in operation. The internal row address strobe signal IRAS is activated when operating the memory cores 34 (when selecting main-word lines MWL).

In this embodiment, the memory cores 34 are designed so that 16 k memory cells (4 k a bank) are refreshed by each single refresh operation. Therefore, generating a refresh request at every 15.6 μs or so can maintain data in all the memory cells (16 k cells×(64 ms/15.6 μs)=64M cells).

In order for the refresh request to occur at the regular intervals, the maximum time (timing specification) of tRAS (/RAS active time) is set at 15.6 μs. tRAS is the time that elapses from the reception of an active command ACT to the reception of a precharge command PRE, in which read/write operations can be performed in succession with word lines selected.

The refresh counter 14 generates a refresh address REFAD. The latch 16 latches an address signal AD, supplied through the address terminals, as a row address signal RAD in synchronization with an active command signal ACTV. The active command signal ACTV is activated upon the reception of the active command ACT for activating the memory cores 34. The latch 18 latches the address signal AD as a column address signal CAD in synchronization with a read/write command signal RW. The read/write command signal RW is activated upon the reception of a read command RD for performing a read operation and a write command WR for performing a write operation.

The address selector 20 transmits the row address signal RAD as an internal row address signal IRAD in normal operations (IREF; low level). In refresh operations, the address selector 20 transmits the refresh address REFAD (upper address) as the internal row address signal IRAD. The address selector 22 transmits the column address signal CAD as an internal column address signal ICAD in normal operations. In refresh operation, the address selector 22 transmits the refresh address (lower address) as the internal column address signal ICAD. The timing generator 24 receives the read/write command signal RW and the refresh signal IREF, and generates a timing signal for operating the column predecoder 32 and a timing signal for operating the segment selector 30.

The timing generators 26 receive the internal row address strobe signal IRAS, and generate a timing signal for operating the row predecoder 28. The row predecoder 28 decodes the internal row address signal IRAD, and output the decoded signal to the row main decoder 36. The segment selector 30 decodes the internal column address signal ICAD to select a segment S and sub-word lines SWL in the segment S. The column predecoder 32 decodes the internal column address signal ICAD, and output the decoded signal to the column main decoder 38.

Figure 2:
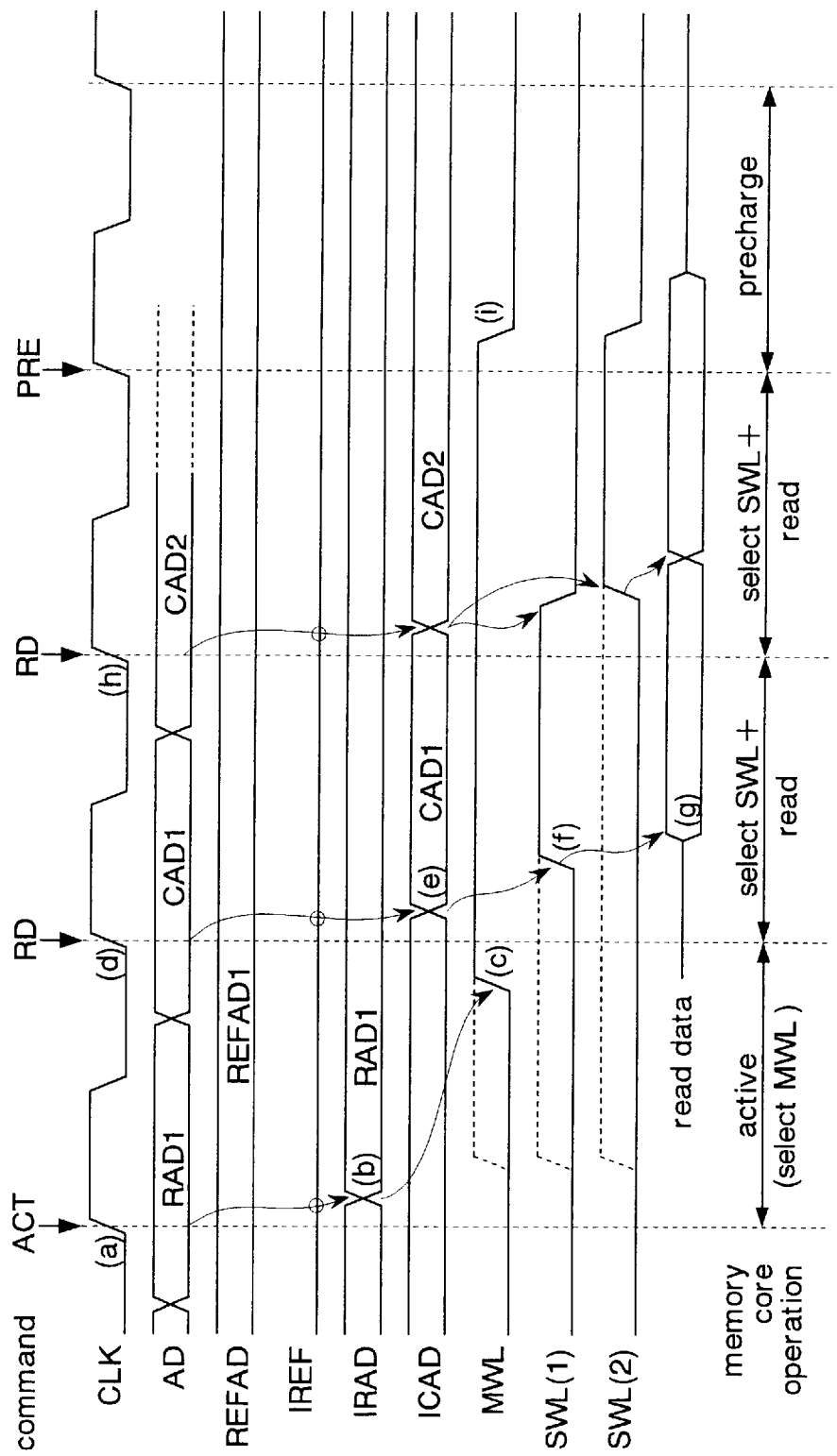
FIG. 2 is a timing chart showing read operations in the first embodiment.

FIG. 2 shows the timing of normal read operations with no occurrence of refresh requests.

Initially, an active command ACT and an address signal AD (RAD1) are supplied in synchronization with the rising edge of a clock signal CLK (FIG. 2(a)). The latch 16 shown in FIG. 1 latches the address signal AD in synchronization with the rising edge of the active command signal ACTV, and outputs the latched signal as the row address signal RAD.

The address selector 20 receives the refresh signal IREF of low level, and transmits the row address signal RAD as the internal row address signal IRAD (FIG. 2(b)). Then, the row predecoder 28 and the row main decoder 36 operate at predetermined timing, activating a main-word line MWL (FIG. 2(c)). Here, the row predecoder 28 is activated at timing later than heretofore, so that the main-word line MWL is activated later than heretofore (the broken lines). Because of the operating frequency of 40 MHz, the late activation timing of the main-word line MWL will not hinder the proper execution of subsequent read operations. Since the control circuits for activating the main-word line MWL operate at a frequency lower than heretofore, the power consumption of these control circuits becomes smaller.

Unlike heretofore (the broken lines), no sub-word lines SWL are inactivated at this point. That is, the main-word line MWL is activated in accordance with the address signal AD that is supplied along with the first active command ACT. Activating the main-word line MWL based on the active command ACT allows a relief judgment to be performed quickly if there is any redundancy circuit for relieving memory cells and the like. Since the main-word line MWL and the sub-word lines SWL are not activated simultaneously, electric currents arising from word line activation decrease in their peaks.

A read command RD and an address signal AD (CAD1) are supplied in synchronization with the rise of the next clock signal CLK (FIG. 2(d)). The latch 18 latches the address signal AD in synchronization with the rising edge of the read/write command signal RW, and outputs the latched signal as the column address signal CAD. The address selector 22 receives the refresh signal IREF of low level, and transmits the column address signal CAD as the internal column address signal ICAD (FIG. 2(e)). The segment selector 30 selects a segment S according to the internal column address signal ICAD, and activate a plurality of sub-word lines SWL(1) in the segment S (FIG. 2(f)). That is, the sub-word lines SWL are activated in accordance with the address signal AD that is supplied along with the second command (read command RD). Then, the column predecoder 32 and the column main decoder 38 operate to output read data (FIG. 2(g)).

Conventionally, all the sub-word lines SWL corresponding to the row address signal RAD were activated. In this embodiment, the sub-word lines SWL are activated by using not only the row address signal RAD but also the column address signal CAD. Therefore, it is possible to reduce the number of sub-word lines SWL to be activated in a read operation. This consequently reduces the power necessary for the word line activation and decreases the number of sense amplifiers to operate, thereby lowering the power consumption in a read operation. For SDRAMs with boosted word lines, their boosters may have lower capacities than heretofore. This means a particularly higher effect of reducing the power consumption. Power consumption is similarly reduced in write operations.

In synchronization with the rising edge of the next clock signal CLK, a read command RD and an address signal AD (CAD2) are supplied (FIG. 2(h)). The segment selectors 30 select a segment S according to the internal column address signal ICAD, and activate a plurality of sub-word lines SWL in the segment S. Then, read operations (page operations) are performed based on the read commands RD supplied in succession. Since the main-word line MWL is kept activated here, data can be read from the segments S which align in the vertical direction of FIG. 1. That is, the read operations can be performed over a wide region of the memory array MA. Moreover, the pre-activation of the main-word line MWL shortens the period between the supply of the read commands RD and the activation of sub-word lines SWL. As a result, the page operations can be performed at high speed. The main-word line MWL is inactivated after the reception of the precharge command PRE (FIG. 2(i)).

Figure 3:
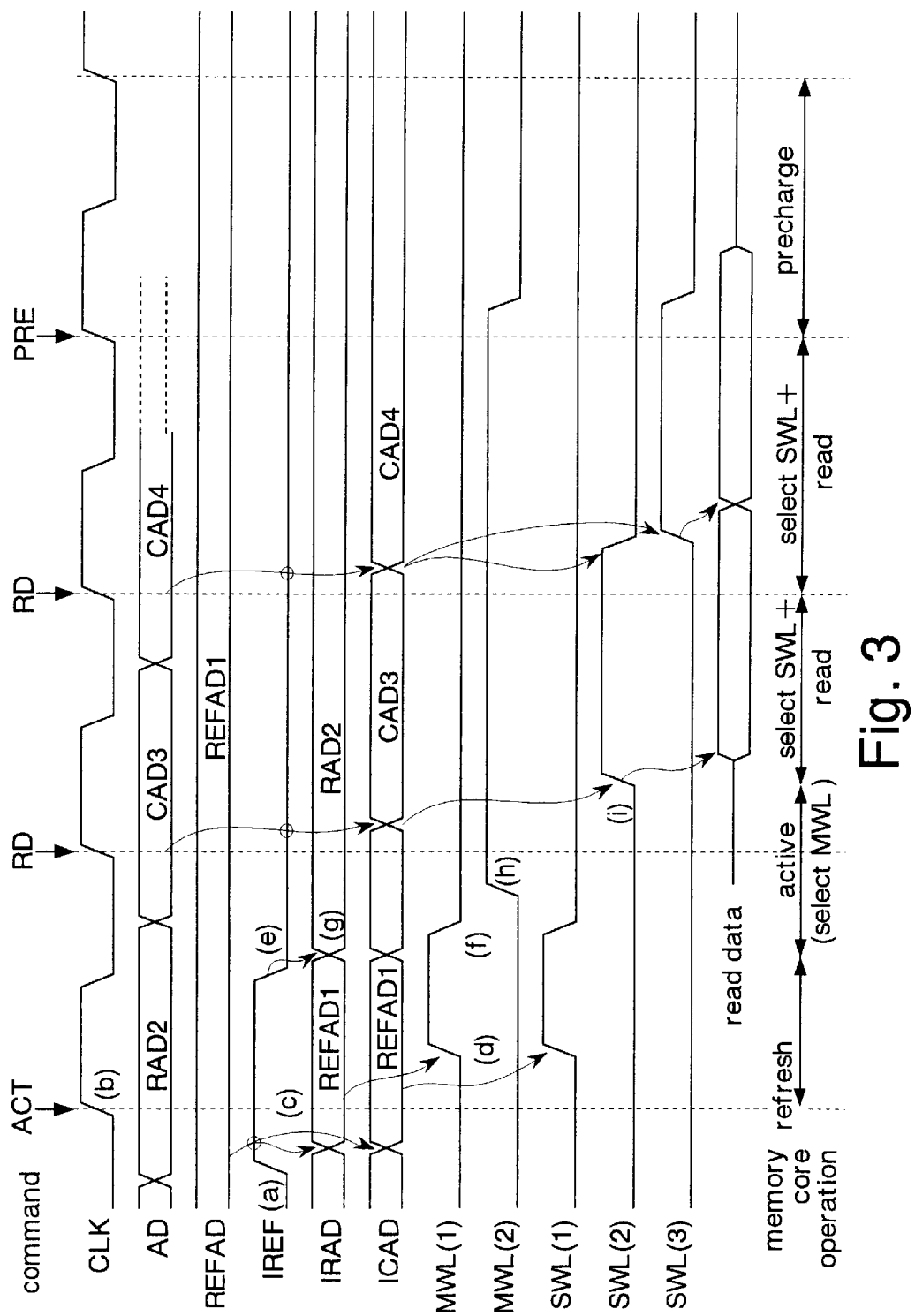
FIG. 3 is another timing chart showing read operations in the first embodiment.

FIG. 3 shows the timing of read operations for situations where a refresh request occurs internally just before the reception of the active command ACT.

Initially, the refresh control circuit 12 shown in FIG. 1 activates the refresh signal IREF in response to the refresh request (FIG. 3(a)). Then, the active command ACT and an address signal AD (RAD2) are supplied in synchronization with the rising edge of the clock signal CLK (FIG. 3(b)). The latch 16 latches the address signal AD in synchronization with the rising edge of the active command signal ACTV. The refresh control circuit 12 activates the internal row address strobe signal IRAS with some delay after the activation of the refresh signal IREF.

The address selectors 20 and 22 receive the refresh signal IREF of high level, and output the refresh address REFAD as the internal row address signal IRAD (upper address) and the internal column address signal ICAD (lower address), respectively (FIG. 3(c)).

The timing generators 24 and 26 receive the refresh signal IREF and the internal row address strobe signal IRAS, and output timing signals to the row predecoder 28 and the segment selector 30, respectively. The row predecoder 28 and the segment selector 30 activate the main-word lines MWL and sub-word lines SWL that correspond to the refresh address REFAD1, thereby performing a refresh operation (FIG. 3(d)).

That is, this SDRAM 10 performs a refresh operation by utilizing the period between the completion of the previous memory operation and the activation of word lines MWL and SWL for the next memory operation. As a result, the refresh operation is performed automatically without any recognition from exterior. Therefore, SDRAM users can design system boards to mount the SDRAM on without consideration of refresh operations.

After the completion of the refresh operation, the refresh control circuit 12 inactivates the refresh signal IREF and the internal row address strobe signal IRAS (FIG. 3(e)). The main-word lines MWL and the sub-word lines SWL are inactivated in response to this inactivation (FIG. 3(f)).

The address selector 20 receives the inactivation of the refresh signal IREF, and outputs the address signal AD (RAD2) as the internal row address signal IRAD (FIG. 3(g)). The refresh control circuit 12 reactivates the internal row address strobe signal IRAS. The row predecoder 28 and the row main decoder 36 operate in almost the same timing as in FIG. 2, activating a main-word line MWL (FIG. 3(h)). Then, as in FIG. 2, read commands RD and address signals AD (CAD3, CAD4) are supplied in succession so that read operations are performed.

Incidentally, if a refresh request occurs during the operation of the memory cores 34, the refresh control circuit 12 completes the operation of the memory cores 34 before the activation of the refresh signal IREF.

As has been described, in the semiconductor memory of the present embodiment, the main-word lines MWL are activated at timing later than heretofore. Besides, the sub-word lines SWL for controlling the transfer transistors of the memory cells are activated not after the reception of the active command ACT but after the reception of the read command RD that is supplied second. Therefore, the control circuits for activating the word lines MWL and SWL can be operated at a frequency lower than heretofore, with a reduction in power consumption.

The use of more address signals than heretofore reduces the number of word lines SWL to be activated at the same time. As a result, the circuits to operate for the sake of memory operations can be reduced in scale, with a reduction in power consumption.

Since the main-word lines MWL are kept activated over a plurality of memory operations, it is possible to perform page operations on wider memory regions.

The activation of the main-word lines MWL prior to that of the sub-word lines SWL can shorten the period between the supply of a read command RD to the activation of the sub-word lines SWL. As a result, page operations can be performed at high speed.

Since the main-word lines MWL are activated in advance, a relief judgment can be performed quickly if there is any redundancy circuit for relieving the memory cells and the like.

There is a sufficient period between the supply of the active command ACT and the activation of the main-word lines MWL. Using this period, a refresh operation can be performed without being recognized from exterior. That is, the refresh of the memory cells can be performed internally and automatically.

The provision of the buffer for holding a refresh request makes it possible to perform a refresh operation securely in the period between the completion of a memory operation and the activation of word lines for the next memory operation.

Figure 4:
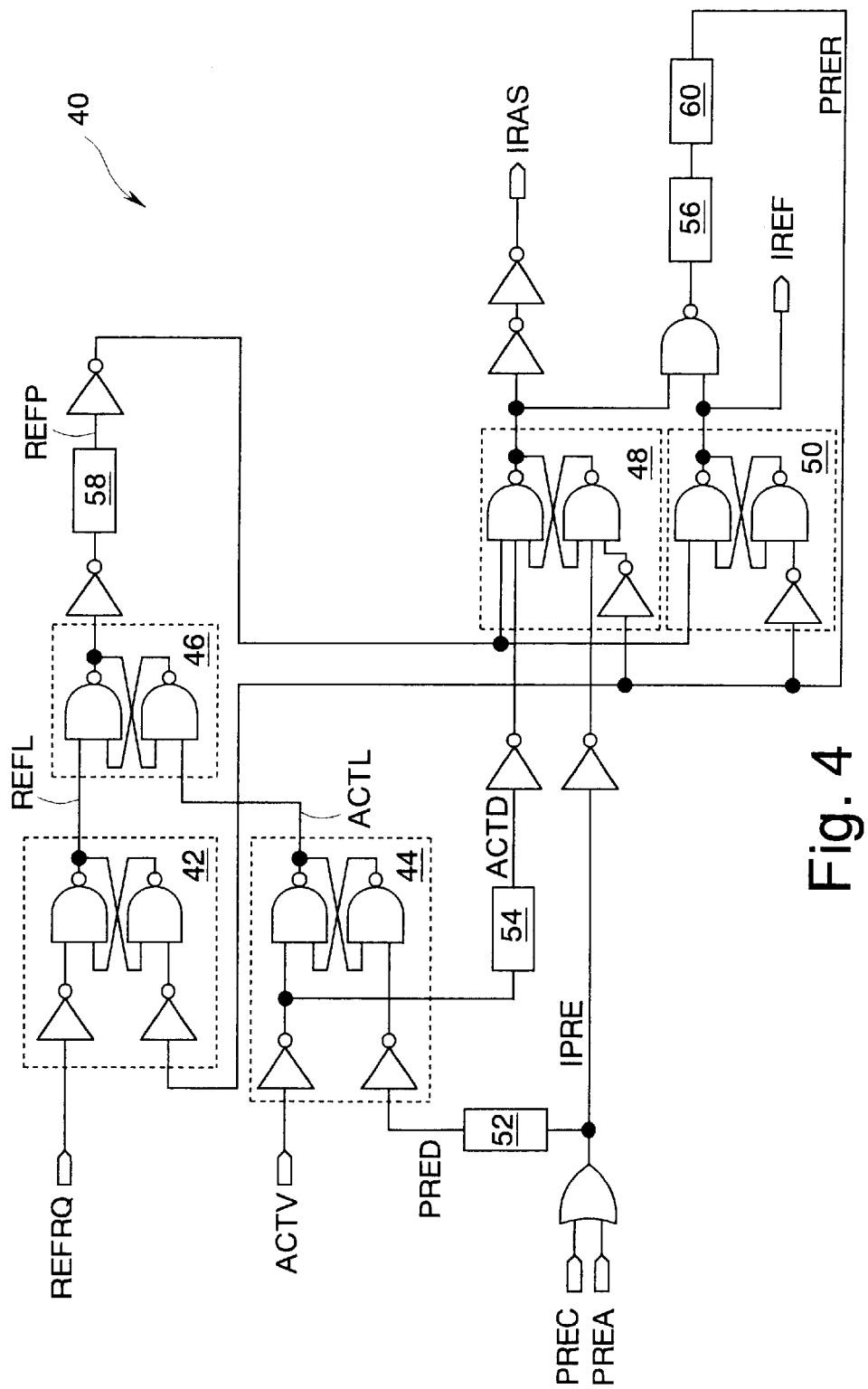
FIG. 4 is a circuit diagram showing a refresh control circuit according to a second embodiment of the present invention.

FIG. 4 shows a second embodiment of the semiconductor memory and the method of operating a semiconductor memory in the present invention. The same signals as those described in the first embodiment will be designated by identical symbols.

This embodiment includes a refresh control circuit 40 that differs from the refresh control circuit 12 of the first embodiment. The other configuration is identical to that of the first embodiment. That is, the sub-word lines SWL are activated by using not only a row address signal but also a column address signal which is supplied along with a read command RD (or write command). This SDRAM has a maximum clock frequency of 40 MHz, and has the function of refreshing its memory cells internally and automatically.

The refresh control circuit 40 comprises flip-flops 42, 44, 46, 48, and 50, delay circuits 52, 54, and 56, pulse generators 58 and 60, a plurality of logic gates, and a not-shown refresh occurring circuit.

The flip-flop 42 is set in response to the activation of a refresh request signal REFRQ, turning a refresh latched signal REFL to high level. The flip-flop 42 is reset in response to the activation of a refresh precharge signal PRER, turning the refresh latched signal REFL to low level. The flip-flop 42 functions as a buffer for holding the refresh request signal REFRQ. The refresh precharge signal PRER is a signal to be automatically generated to perform a precharge operation after the completion of a refresh operation.

The flip-flop 44 is set in response to the activation of the active command signal ACTV, turning an active latched signal ACTL to high level. The flip-flop 44 is reset in response to the activation of a delayed precharge signal PRED, turning the active latched signal ACTL to low level. The delayed precharge signal PRED is generated from a precharge signal PREC to be activated in accordance with a precharge command PRE supplied from exterior, or an auto-precharge signal PREA to be activated in an auto-precharge operation. The delay circuit 52 delays the timing of activation of the delayed precharge signal PRED by tRP (/RAS Precharge time) after the activation of the precharge signal PREC or the auto-precharge signal PREA. The delay circuit 52 thereby inhibits a refresh request from being received during precharge. tRP is the time that elapses from the reception of the PRE command to the reception of the next ACTV command, and is necessary for a precharge operation.

The flip-flop 46 resets its output node in response to the activation of the refresh latched signal REFL, and sets the output node in response to the activation of the active latched signal ACTL. The pulse generator 58 generates a refresh pulse REFP of high level when the refresh latched signal REFL is activated to change the output node of the flip-flop 46 to low level.

The flip-flop 48 is set in response to the generation of the refresh pulse REFP or the activation of a delayed active signal ACTD, thereby activating the internal row address strobe signal IRAS. The flip-flop 48 is reset in response to the activation of the refresh precharge signal PRER or the activation of an internal precharge signal IPRE, thereby inactivating the internal row address strobe signal IRAS.

The delayed active signal ACTD is activated with as much delay as the delay time of the delay circuit 54 after the activation of the active command signal ACTV. The delay time of the delay circuit 54 is set to a value required for a single refresh operation and a following precharge operation. This allows a refresh cycle to be inserted into the period between the reception of the active command ACT and the activation of the internal row address strobe signal IRAS. The internal precharge signal IPRE is activated in response to the activation of the precharge signal PREC or the auto-precharge signal PREA.

The flip-flop 50 is set in response to the occurrence of the refresh pulse REFP, activating the internal refresh signal IREF. The flip-flop 50 is reset in response to the activation of the refresh precharge signal PRER, inactivating the internal refresh signal IREF.

The pulse generator 60 generates the refresh precharge signal PRER (a pulse of high level) when the signal output from the delay circuit 56 changes to high level.

The refresh precharge signal PRER is generated in a refresh operation, with as much delay as the delay time of the delay circuit 56 after the flip-flop 48 is set. The delay time of the delay circuit 56 is set to a time necessary for a single refresh operation. On this account, a refresh operation can be surely performed before a precharge operation.

Figure 5:
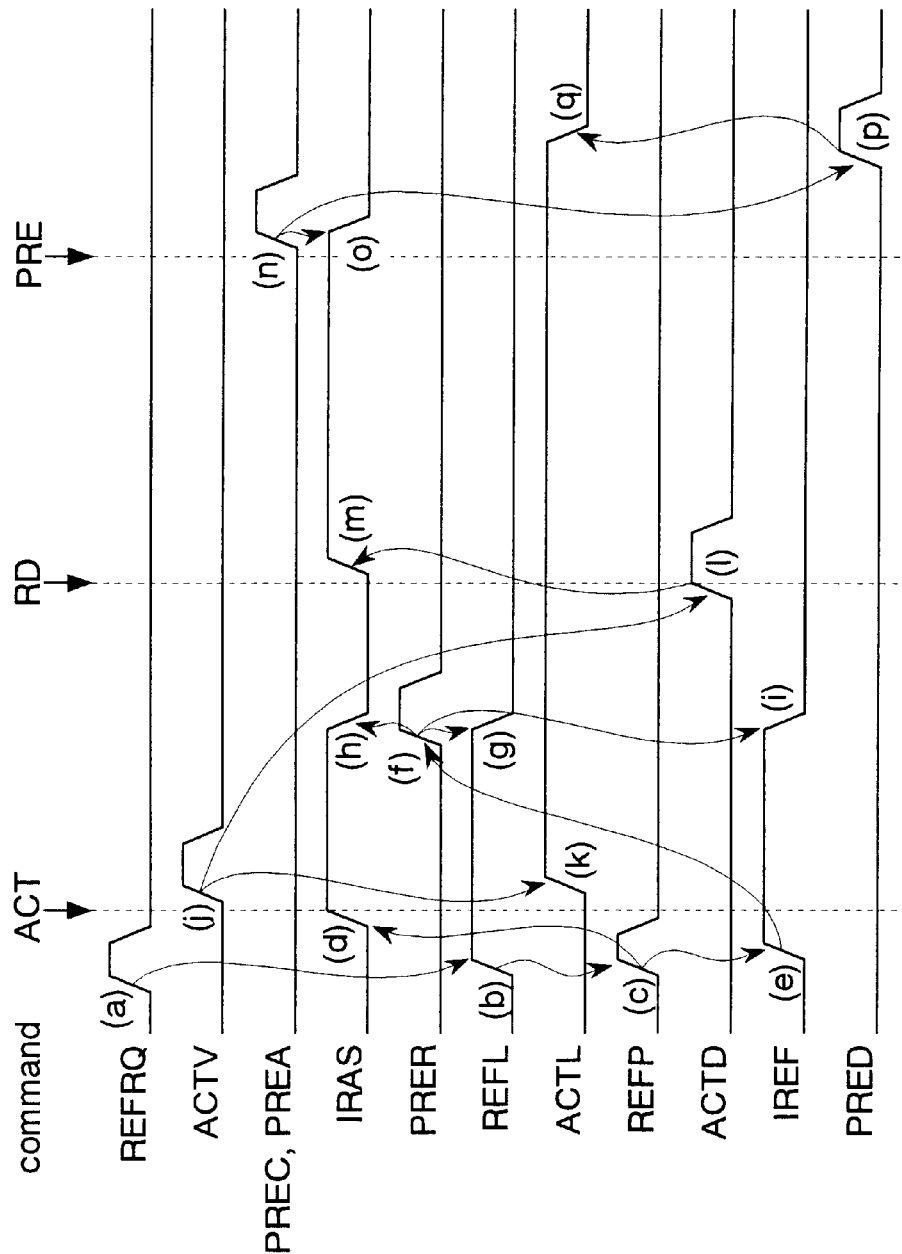
FIG. 5 is a timing chart showing a read operation in the second embodiment.

FIG. 5 shows the operation timing of the refresh control circuit 40 in a read operation when a refresh request occurs internally just before the reception of the active command ACT.

Initially, the occurrence of the refresh request activates the refresh request signal REFRQ (FIG. 5(a)). The flip-flop 42 shown in FIG. 4 activates the refresh latched signal REFL in synchronization with the rising edge of the refresh request signal REFRQ (FIG. 5(b)). That is, the refresh request is held by the flip-flop 42. Here, the active command ACT is yet to be supplied and the active latched signal ACTL is at low level. The flip-flop 46 is therefore reset in response to the activation of the refresh latched signal REFL. The pulse generator 58 outputs the refresh pulse REFP (FIG. 5(c)).

The flip-flop 48 is set in accordance with the refresh pulse signal REFP, activating the internal row address strobe signal IRAS (FIG. 5(d)). The flip-flop 50 is set in accordance with the refresh pulse signal REFP, activating the internal refresh signal IREF (FIG. 5(e)). Then, a refresh operation is performed in the period over which the internal row address strobe signal IRAS and the internal refresh signal IREF are activated. The internal refresh signal IREF is transmitted to the delay circuit 56 and the pulse generator 60 so that the refresh precharge signal PRER is activated upon the completion of the refresh operation (FIG. 5(f)). A precharge operation is performed by the activation of the refresh precharge signal PRER.

The flip-flops 42, 48, and 50 are reset in response to the activation of the refresh precharge signal PRER, thereby inactivating the refresh latched signal REFL, the internal row address strobe signal IRAS, and the internal refresh signal IREF, respectively (FIGS. 5(g, h, i)).

Meanwhile, the supply of the active command ACT activates the active command signal ACTV (FIG. 5(j)). The flip-flop 44 is set in response to the activation of the active command signal ACTV, activating the active latched signal ACTL (FIG. 5(k)). The delay circuit 54 activates the delayed active signal ACTD in response to the activation of the active command signal ACTV (FIG. 5(l)).

The flip-flop 48 is set in response to the activation of the delayed active signal ACTD, thereby reactivating the internal row address strobe signal IRAS (FIG. 5(m)). Next, the read command RD is supplied to perform a read operation. Even in this embodiment, the number of sub-word lines to be activated becomes smaller than heretofore, with a reduction in power consumption.

Then, the supply of the precharge command PRE activates the precharge signal PREC (FIG. 5(n)). The flip-flop 48 is reset in response to the activation of the precharge signal PREC, inactivating the internal row address strobe signal IRAS (FIG. 5(o)). The delay circuit 52 delays the internal precharge signal IPRE, and outputs the resultant as the delayed precharge signal PRED (FIG. 5(p)). The flip-flop 44 is reset in response to the activation of the delayed precharge signal PRED, inactivating the active latched signal ACTL (FIG. 5(q)). Then, the precharge operation is completed.

The refresh operation is performed by utilizing the period between the completion of the previous memory operation and the activation of word lines MWL and SWL for the next memory operation. Consequently, as in the first embodiment, the refresh operation is performed automatically without any recognition from exterior.

Figure 6:
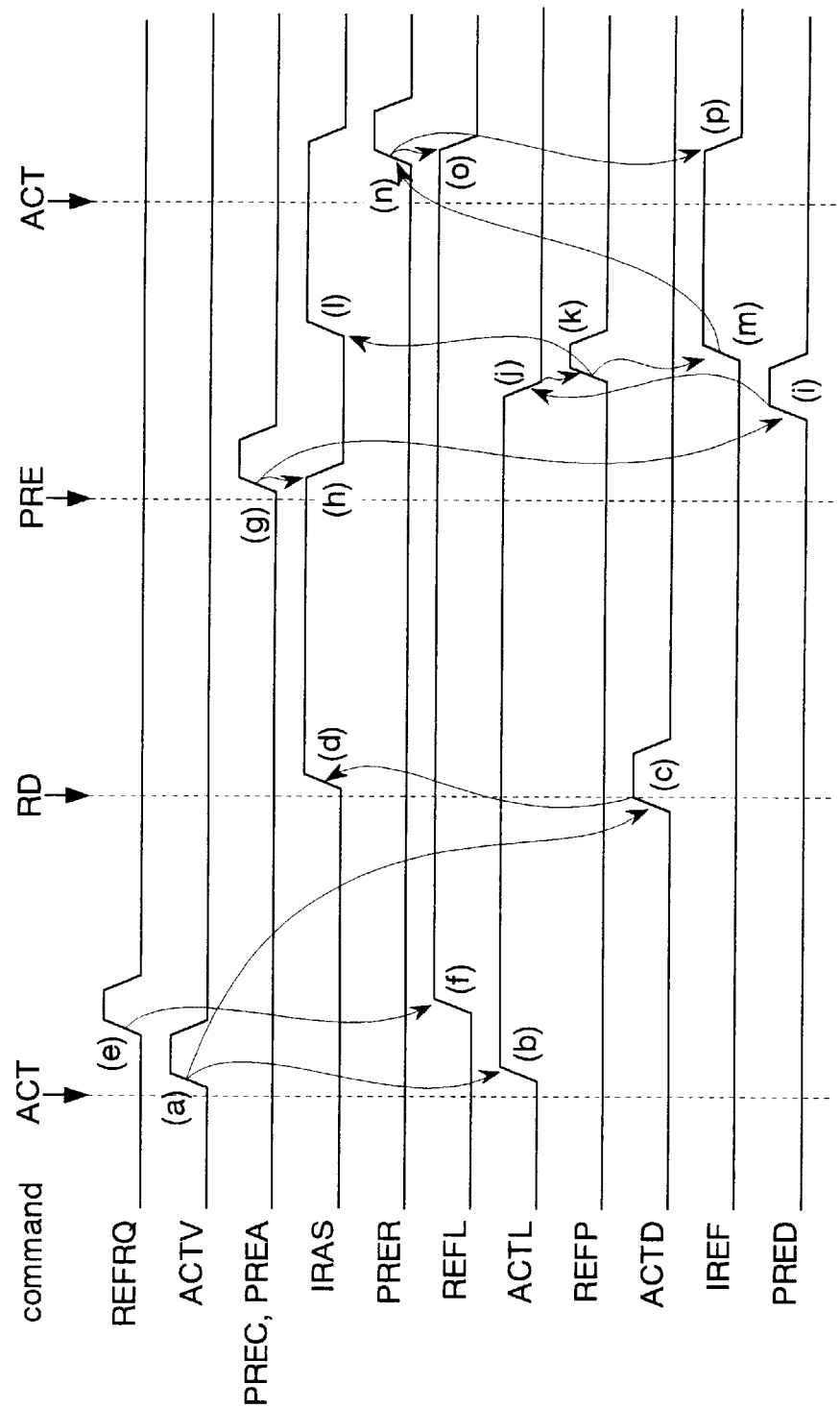
FIG. 6 is another timing chart showing a read operation in the second embodiment.

FIG. 6 shows the operation timing of the refresh control circuit 40 for situations where a refresh request occurs internally after the reception of the active command ACT.

Initially, the active command ACT is supplied to activate the active command signal ACTV (FIG. 6(a)). The flip-flop 44 and the delay circuit 54 activate, as in FIG. 5, the active latched signal ACTL and the delayed active signal ACTD, respectively (FIGS. 6(b, c)).

The flip-flop 48 is set in response to the activation of the delayed active signal ACTD, thereby reactivating the internal row address strobe signal IRAS (FIG. 6(d)). Then, the read command RD is supplied so that predetermined word lines are selected for a read operation. Here, no refresh operation is performed yet.

After the reception of the active command ACT, a refresh request occurs to activate the refresh request signal REFRQ (FIG. 6(e)). The flip-flop 42 is set in response to the activation of the refresh request signal REFRQ, thereby activating the refresh latched signal REFL (FIG. 6(f)). That is, it holds the refresh request. The flip-flop 46, however, has received the activation of the active latched signal ACTL before the activation of the refresh latched signal REFL. The flip-flop 46 is therefore kept set, not reset.

After the execution of the read operation, the precharge command PRE is supplied to activate the precharge signal PREC (FIG. 6(g)). The flip-flop 48 is reset in response to the activation of the precharge signal PREC, thereby inactivating the internal row address strobe signal IRAS (FIG. 6(h)). The delay circuit 52 delays the internal precharge signal IPRE, and outputs the resultant as the delayed precharge signal PRED (FIG. 6(i)). The flip-flop 44 is reset in response to the activation of the delayed precharge signal PRED, inactivating the active latched signal ACTL (FIG. 6(j)).

The flip-flop 46 is reset in response to the inactivation of the active latched signal ACTL, turning its output node to low level. The pulse generator 58 outputs the refresh pulse REFP in response to the reset of the flip-flop 46 (FIG. 6(k)).

Then, as in FIG. 5, the internal precharge signal IPRE is reactivated (FIG. 6(l)) and the internal refresh signal IREF is activated (FIG. 6(m)) to perform a refresh operation. Moreover, the refresh precharge signal PRER is activated to perform a precharge operation (FIG. 6(n)), whereby the refresh latched signal REFL and the internal refresh signal IREF are inactivated (FIGS. 6(o, p)).

The precharge operation is performed immediately after the supply of the next command (for example, the active command ACT). Therefore, even if a refresh operation is performed after the read operation, this refresh operation has no effect on the memory operation according to the next command. That is, the refresh operation is performed automatically without any recognition from exterior. Incidentally, the worst timing of a refresh request is one in which the refresh request occurs internally just before the reception of the active command ACT (FIG. 5).

This embodiment can offer the same effects as those obtained from the first embodiment described above.

Figure 7:
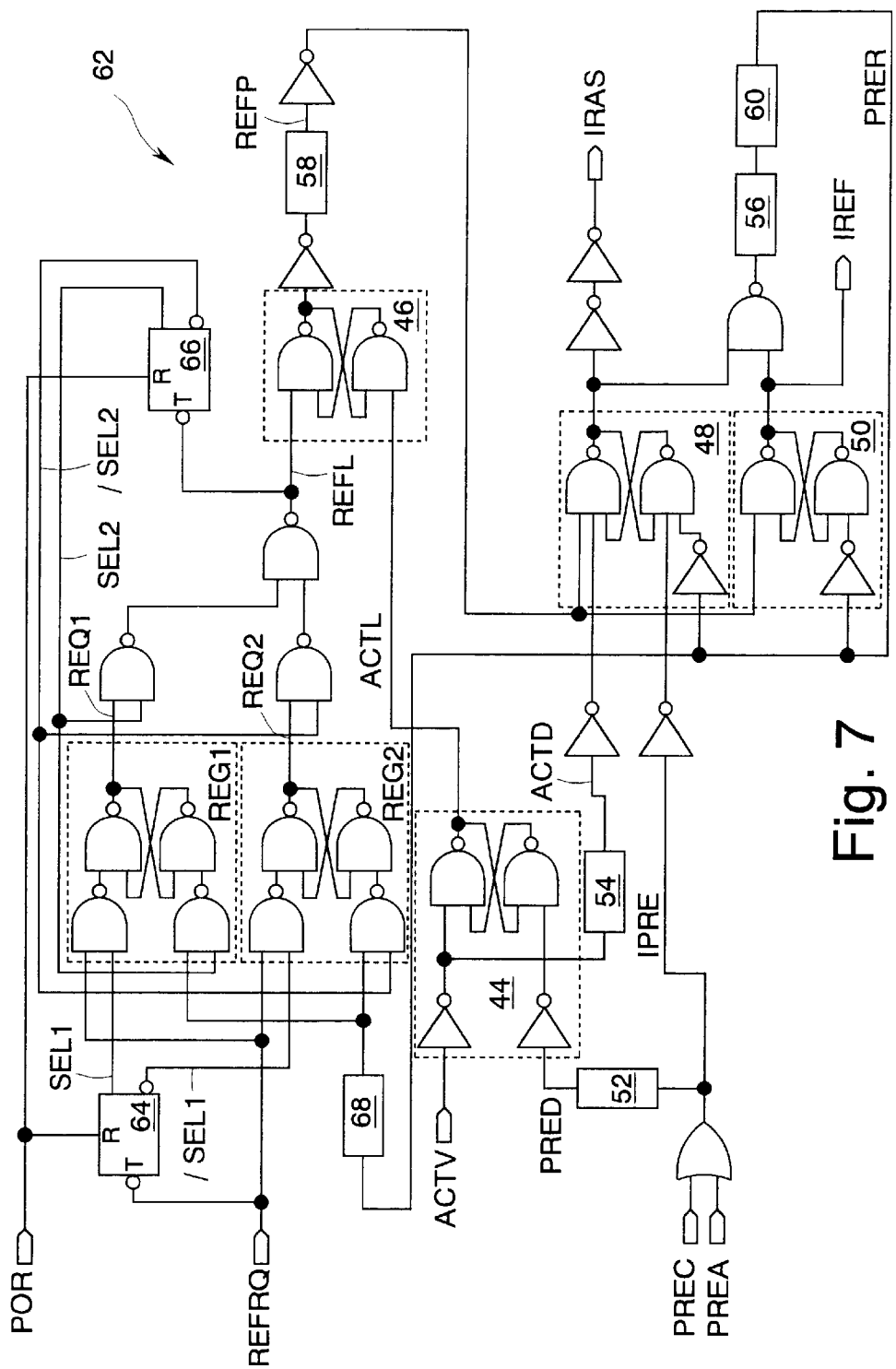
FIG. 7 is a circuit diagram showing a refresh control circuit according to a third embodiment of the present invention.

FIG. 7 shows a third embodiment of the semiconductor memory and the method of operating a semiconductor memory in the present invention. The same circuits and signals as those described in the second embodiment will be designated by identical reference numbers or symbols. Detailed description of these circuits and signals will be omitted here.

This embodiment includes a refresh control circuit 62 that differs from the refresh control circuit 12 of the first embodiment. The other configuration is identical to that of the first embodiment. That is, the SDRAM of this embodiment activates its main-word lines MWL by using not only a row address signal RAD but also a column address signal CAD which is supplied along with a read command RD (or write command). The SDRAM has a maximum clock frequency of 40 MHz, and has the function of refreshing its memory cells internally and automatically.

The refresh control circuit 62 has registers REG1 and REG2 composed of flip-flops, toggle flip-flops 64 and 66, and a delay circuit 68. The refresh control circuit 62 also has flip-flops 44, 46, 48, and 50, delay circuits 52, 54, and 56, and pulse generators 58 and 60 which are the same as those of the second embodiment, along with a plurality of logic gates. The delay circuit 68 is the same as the delay circuit 52. That is, the delay circuit 68 delays the refresh precharge signal PRER by tRP.

The toggle flip-flop 64 inverts the levels of select signals SEL1 and /SEL1 in synchronization with the falling edge of the refresh request signal REFRQ. The toggle flip-flop 66 inverts the levels of select signals SEL2 and /SEL2 in synchronization with the falling edge of the refresh latched signal REFL. The toggle flip-flops 64 and 66 are reset by a power-on resetting signal POR which is activated when the power supply is turned on.

The register REG1 enables its setting function when the select signal SEL1 is at high level, and enables its resetting function when the select signal SEL2 is at high level. That is, the register REG1 activates a request signal REQ1 in response to the rising edge of the refresh request signal REFRQ when the select signal SEL1 is at high level. It inactivates the request signal REQ1 in response to the rising edge of the refresh precharge signal PRER when the select signal SEL2 is at high level.

Similarly, the register REG2 activates a request signal REQ2 in response to the rising edge of the refresh request signal REFRQ when the select signal /SEL1 is at high level. It inactivates the request signal REQ2 in response to the rising edge of the refresh precharge signal PRER when the select signal /SEL2 is at high level. Since the select signals SEL1, /SEL1 and the select signals SEL2, /SEL2 are both complementary signals, the registers REG1 and REG2 function as buffers for holding the refresh request signal REFRQ alternately. That is, in the present embodiment, the refresh control circuit 62 can hold two internally-occurring refresh requests.

The request signals REQ1 and REQ2 are transmitted to the flip-flop 46 and the toggle flip-flop 66 as the refresh latched signal REFL when the select signals SEL2 and /SEL2 are at high level, respectively.

The flip-flops 44, 46, 48, and 50, the delay circuits 52, 54, and 56, the pulse generators 58 and 60, and the logic gates are connected as in the second embodiment.

Figure 8:
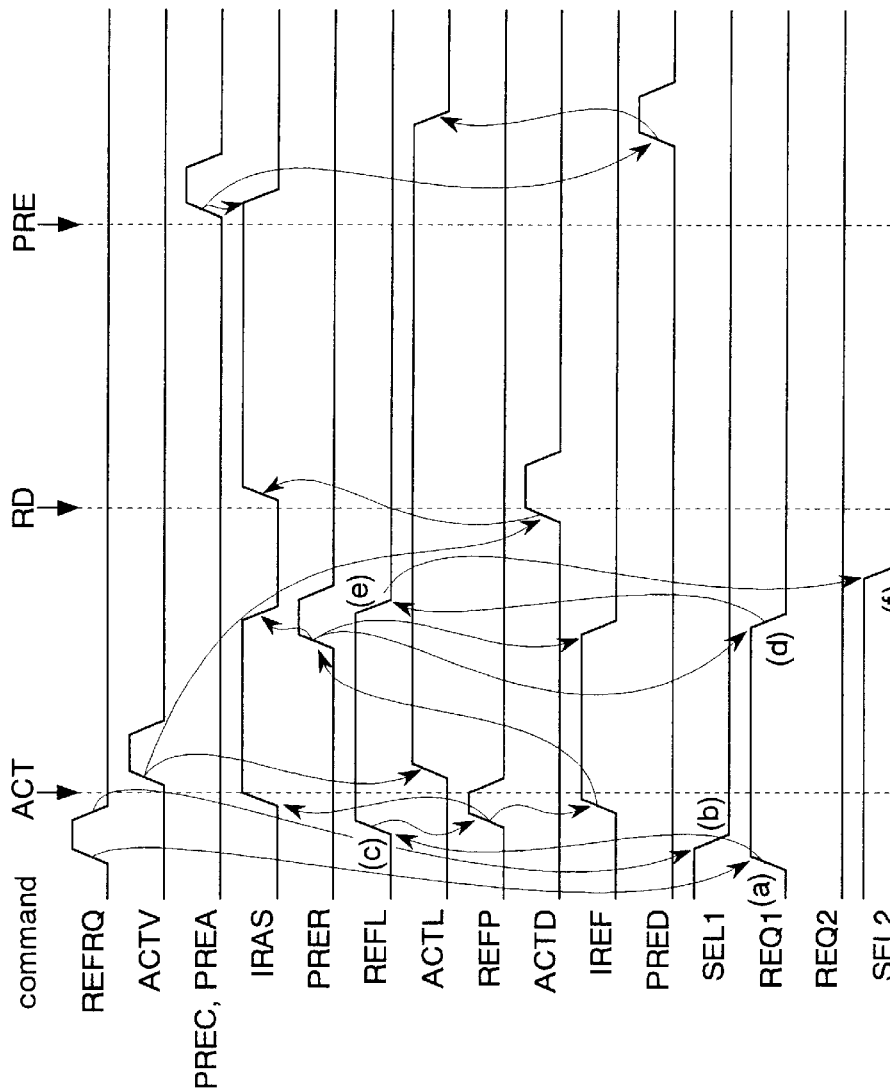
FIG. 8 is a timing chart showing a read operation in the third embodiment.

FIG. 8 shows the operation timing of the refresh control circuit 62 in a read operation when a refresh request occurs internally just before the reception of the active command ACT. The timing of the signals except the select signals SEL1, SEL2 and the request signals REQ1, REQ2 is the same as in FIG. 5 described above. In this example, the timing chart starts with the select signals SEL1 and SEL2 at high level, the register REG1 enabled, and the register REG2 disabled.

Initially, the register REG1 shown in FIG. 7 is set in synchronization with the rising edge of the refresh request signal REFRQ, changing the request signal REQ1 to high level (FIG. 8(a)). The toggle flip-flop 64 turns the select signal SELL to low level in synchronization with the falling edge of the refresh request signal REFRQ (FIG. 8(b)). Due to the change of the select signal SEL1, the register REG1 disables the reception of a refresh request and the register REG2 enables the reception of a refresh request.

The high level of the request signal REQ1 turns the refresh latched signal REFL to high level (FIG. 8(c)). Then, the refresh control circuit 62 operates as in FIG. 5, thereby performing a refresh operation and a post-refresh precharge operation.

The register REG1 changes the request signal REQ1 to low level in accordance with the refresh precharge signal PRER which is activated after the refresh operation (FIG.

8(*d*)). The refresh latched signal REFL is turned to low level in accordance with the change of the request signal REQ1 (FIG. 8(*e*)). The toggle flip-flop 66 turns the select signal SEL2 to low level in synchronization with the falling edge of the refresh latched signal REFL (FIG. 8(*f*)). The refresh request to occur subsequently will be held by the register REG2.

Next, the read command RD and the precharge command PRE are supplied in succession so that a read operation and a precharge operation are performed. That is, even in this embodiment, the refresh operation is performed automatically without any recognition from exterior.

Figure 9:
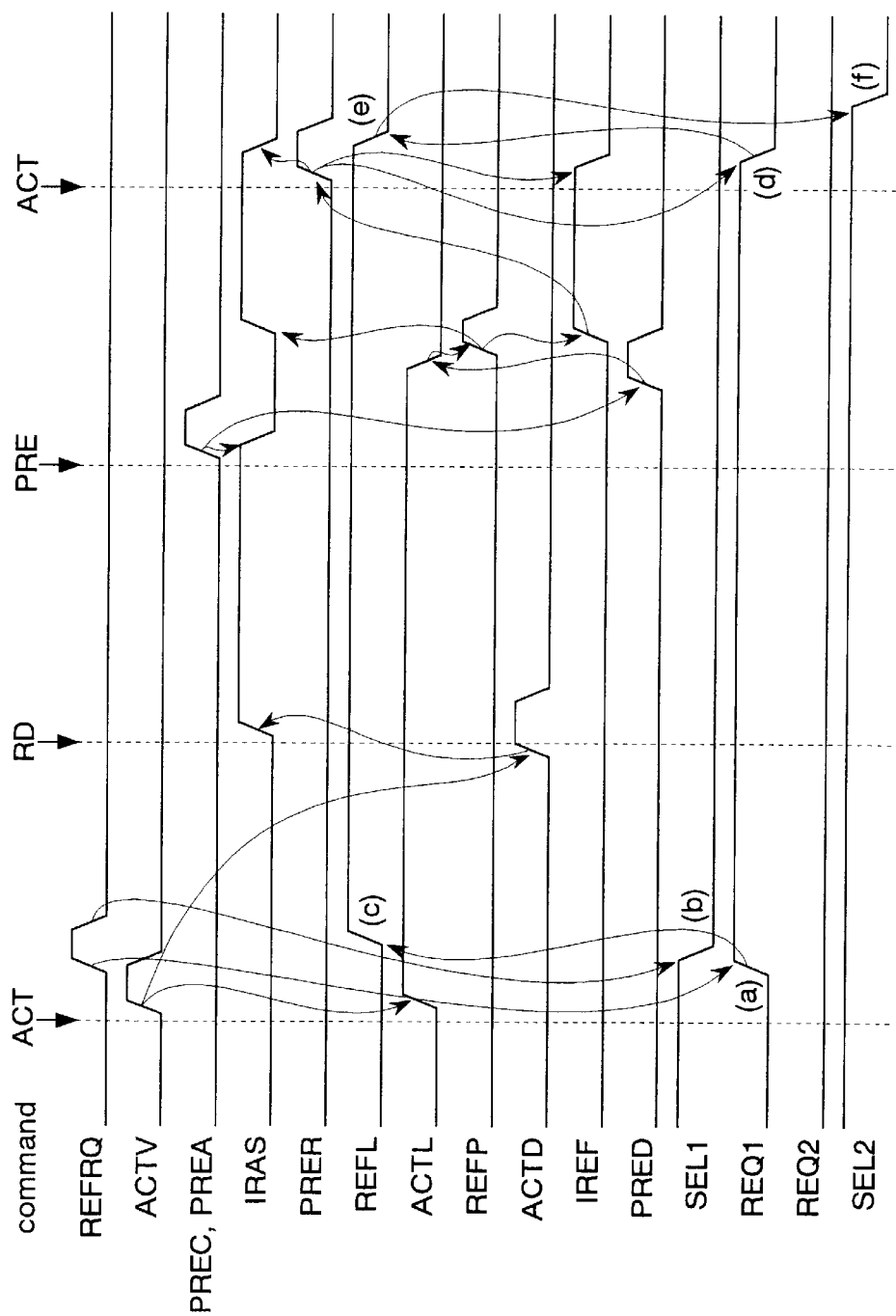
FIG. 9 is another timing chart showing a read operation in the third embodiment.

FIG. 9 shows the operation timing of the refresh control circuit 62 for situations where a refresh request occurs internally after the reception of the active command ACT. The timing of the signals except the select signals SEL1, SEL2 and the request signals REQ1, REQ2 is the same as in FIG. 6 described above. In this example, the timing chart starts with the select signals SEL1 and SEL2 at high level, the register REG1 enabled, and the register REG2 disabled.

Initially, the active command ACT and the read command RD are supplied in succession so that a read operation is performed as in FIG. 6.

When a refresh request occurs after the supply of the active command ACT, the request signal REQ1 is turned to high level in synchronization with the rising edge of the refresh request signal REFRQ (FIG. 9(*a*)). The select signal SEL1 is turned to low level in synchronization with the falling edge of the refresh request signal REFRQ (FIG. 9(*b*)). The refresh request to occur subsequently will be held by the register REG2. The refresh latched signal REFL is turned to high level in response to the high level of the request signal REQ1 (FIG. 9(*c*)).

Next, as in FIG. 6, a read operation and a precharge operation are performed. After the precharge operation is performed, the refresh operation is performed, and then the precharge operation is performed after the refresh operation. Then, as in FIG. 8, the request signal REQ1 is changed to low level in response to the rise of the refresh precharge signal PRER (FIG. 9(*d*)). The refresh latched signal REFL is turned to low level in accordance with the change of the request signal REQ1 (FIG. 9(*e*)). The select signal SEL2 is turned to low level in synchronization with the falling edge of the refresh latched signal REFL (FIG. 9(*f*)).

Like FIG. 6, even in this example, the refresh operation is performed automatically without any recognition from exterior.

Figure 10:
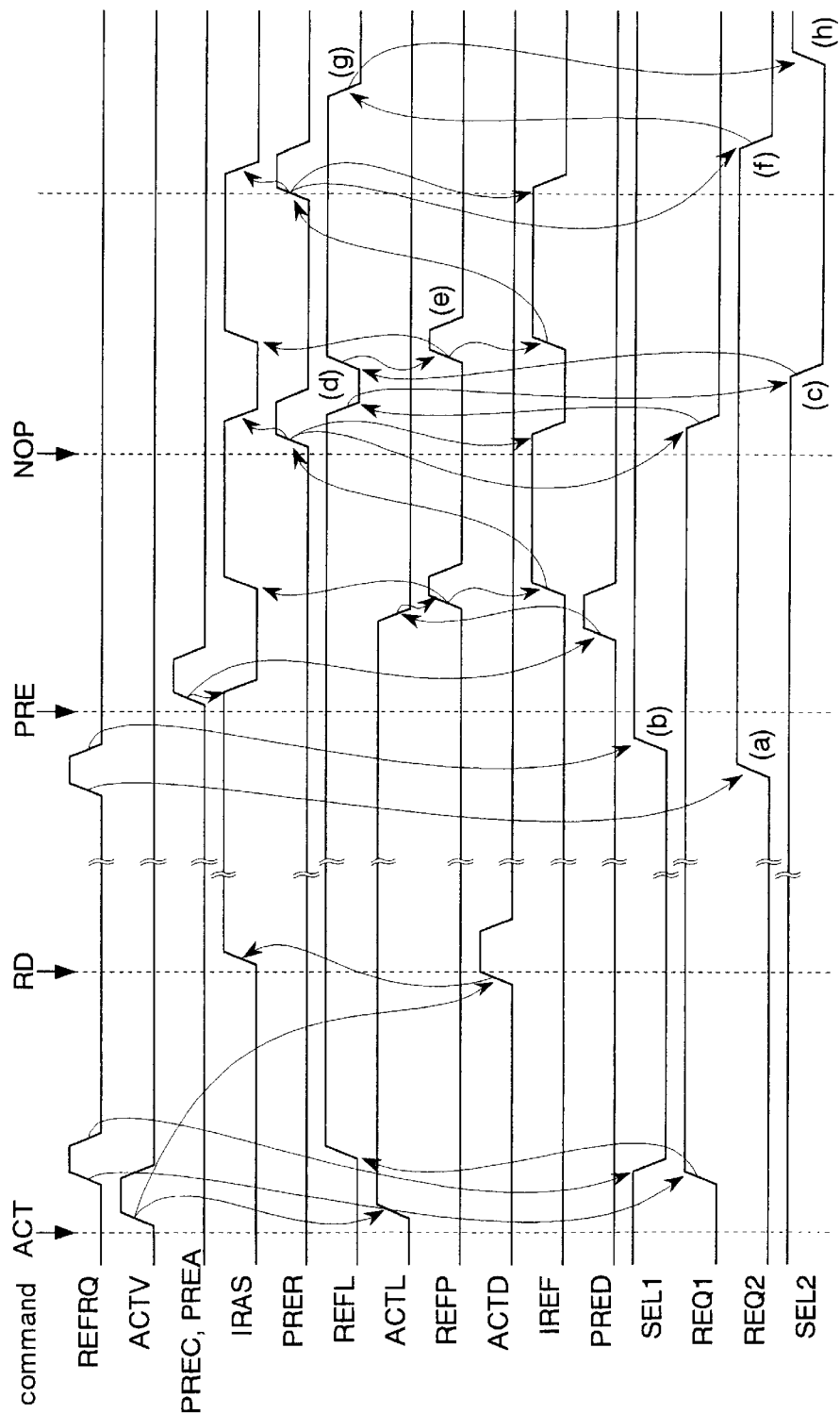
FIG. 10 is another timing chart showing a read operation in the third embodiment.

FIG. 10 shows the operation timing of the refresh control circuit 62 in read operations when two refresh requests occur internally during the read operations (page operations) which follow the reception of the active command ACT. In this example, the timing chart also starts with the select signals SEL1 and SEL2 at high level, the register REG1 enabled, and the register REG2 disabled.

After receiving the active command ACT, the timing from a first refresh request to the performance of the read operation, is the same as in FIG. 9 described above. Thus, description thereof will be omitted here.

After the page operation, a second refresh request occurs before the reception of the precharge command PRE, so that the refresh request signal REFRQ is turned to high level (FIG. 10(*a*)). The second refresh request is not limited to this timing. For example, it may occur during the page operation. Here, the select signals SEL1 and /SEL1 are at low level and high level, respectively. Therefore, the refresh request is held by the register REG2.

When refresh requests are to occur at predetermined intervals, some memory cells can delay in refresh and cause a data loss if the page operation period is longer than the interval of occurrence of the refresh requests (refresh period). For this reason, the maximum number of page operations is restricted in accordance with the refresh period. In this embodiment, the refresh control circuit 62 can hold two refresh requests. Thus, the maximum number of page operations may be approximately twice that of the second embodiment.

The register REG2 turns the request signal REQ2 to high level in synchronization with the rising edge of the refresh request signal REFRQ. The toggle flip-flop 64 turns the select signals /SEL1 and SEL1 to low level and high level, respectively, in synchronization with the falling edge of the refresh request signal REFRQ (FIG. 10(*b*)). That is, the register REG2 receives the refresh request before the register REG1 re-enables the reception of a refresh request and the register REG2 disables the reception of a refresh request.

Then, the precharge command PRE is supplied to perform a precharge operation, followed by a first refresh operation as in FIG. 9. After the refresh operation, the refresh latched signal REFL is inactivated so that the select signals SEL2 and /SEL2 change to low level and high level, respectively (FIG. 10(*c*)). Here, the register REG2 holds the second refresh request, outputting the request signal REQ2 of high level. On this account, the refresh latched signal REFL is reactivated in response to the changes of the select signals SEL2 and /SEL2 (FIG. 10(*d*)).

In this example, a no-operation command NOP is supplied after the precharge command PRE. Since the active latched signal ACTL is at low level, the flip-flop 46 is reset in synchronization with the rising edge of the refresh latched signal REFL. Then, the refresh pulse REFP is generated (FIG. 10(*e*)), and a second refresh operation is performed as the first refresh operation was.

The activation of the refresh precharge signal PRER that follows the refresh operation resets the register REG2, changing the request signal REQ2 to low level (FIG. 10(*f*)). The refresh latched signal REFL is inactivated in accordance with the change of the request signal REQ2 (FIG. 10(*g*)), so that the select signals SEL2 and /SEL2 change to high level and low level, respectively (FIG. 10(*h*)). That is, the registers REG1 and REG2 restore their states to before the reception of the active command ACT.

Incidentally, if an active command ACT is supplied after the precharge command PRE, the second refresh operation is performed after the memory operation as in FIG. 9.

This embodiment can offer the same effects as those obtained from the first embodiment described above. Moreover, in this embodiment, the registers REG1 and REG2 can hold two refresh requests. This means an increase in the number of accesses that can be made within a single page operation.

Figure 11:
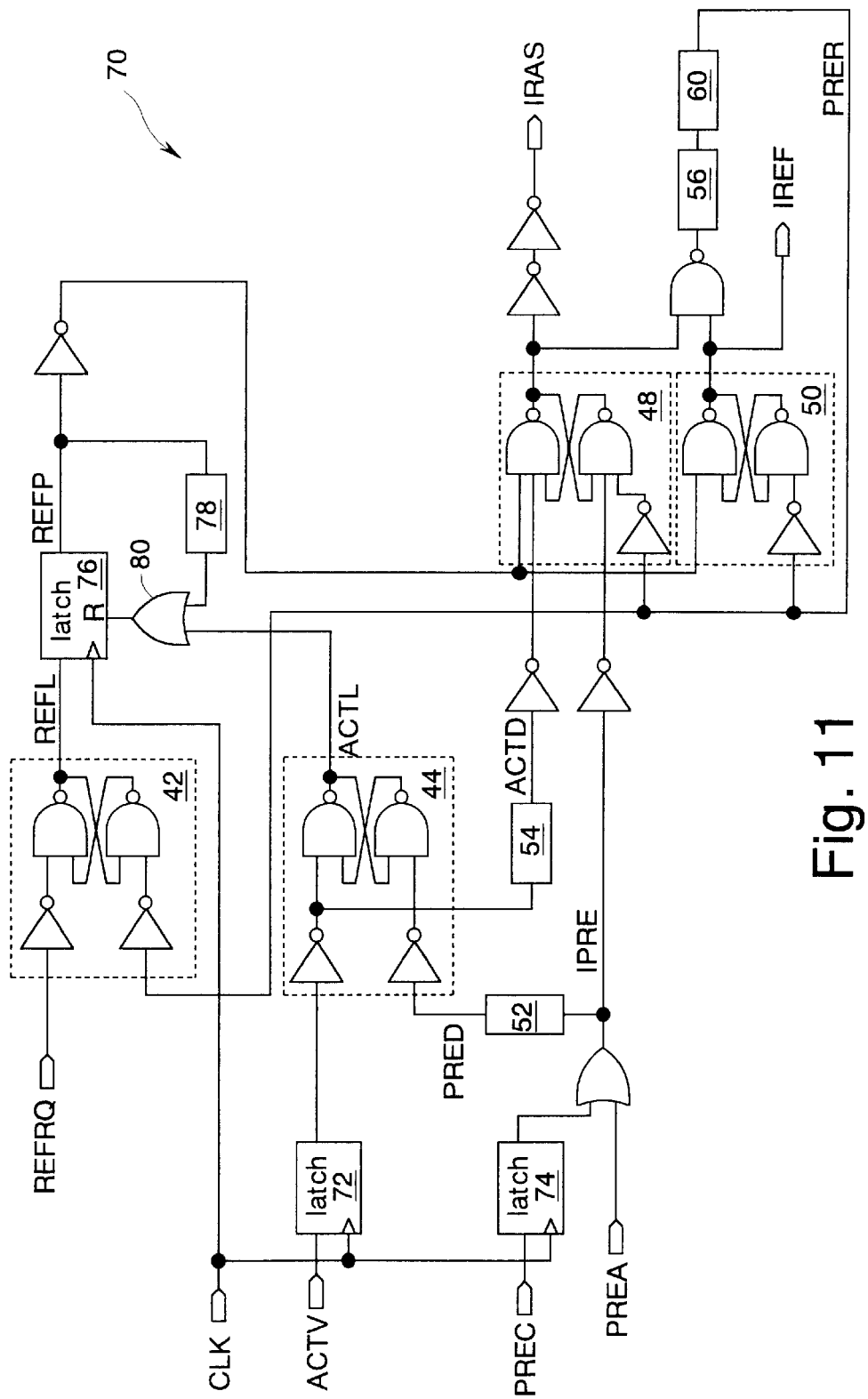
FIG. 11 is a circuit diagram showing a refresh control circuit according to a fourth embodiment of the present invention.

FIG. 11 shows a fourth embodiment of the semiconductor memory and the method of operating a semiconductor memory in the present invention. The same circuits and signals as those described in the second embodiment will be designated by identical reference numbers or symbols. Detailed description of these circuits and signals will be omitted here.

This embodiment includes a refresh control circuit 70 that differs from the refresh control circuit 12 of the first embodiment. The other configuration is identical to that of the first embodiment.

The refresh control circuit 70 has latches 72 and 74, flip-flops 42, 44, 48, and 50, delay circuits 52, 54, and 56, a pulse generator 60, a plurality of logic gates, a latch 76, a delay circuit 78, and an OR gate 80. The latches 72 and 74 latch the active command signal ACTV and the precharge signal PREC, respectively, in synchronization with the rising edge of the clock signal CLK. The flip-flops 42, 44, 48, and 50, the delay circuits 52, 54, and 56, and the pulse generator 60 are the same as those of the second embodiment. The latch 76, the delay circuit 78, and the OR gate 80 substitute as the flip-flop 46 of the second embodiment.

The output of the latch 72 is connected to the set terminal of the flip-flop 44. The output of the latch 74 is connected to an input of the OR gate that generates the internal precharge signal IPRE. The latch 76 latches the refresh latched signal REFL in synchronization with the rising edge of the clock signal CLK, and outputs the latched signal as the refresh pulse REFP. The refresh pulse REFP is fed back to the reset terminal R of the latch 76 through the delay circuit 78 and the OR gate 80. The reset terminal R of the latch 76 is also supplied with the active latched signal ACTL through the OR gate 80.

The flip-flops 42, 44, 48, and 50, the delay circuits 52, 54, and 56, the pulse generator 60, and the logic gates are connected as in the second embodiment.

Figure 12:
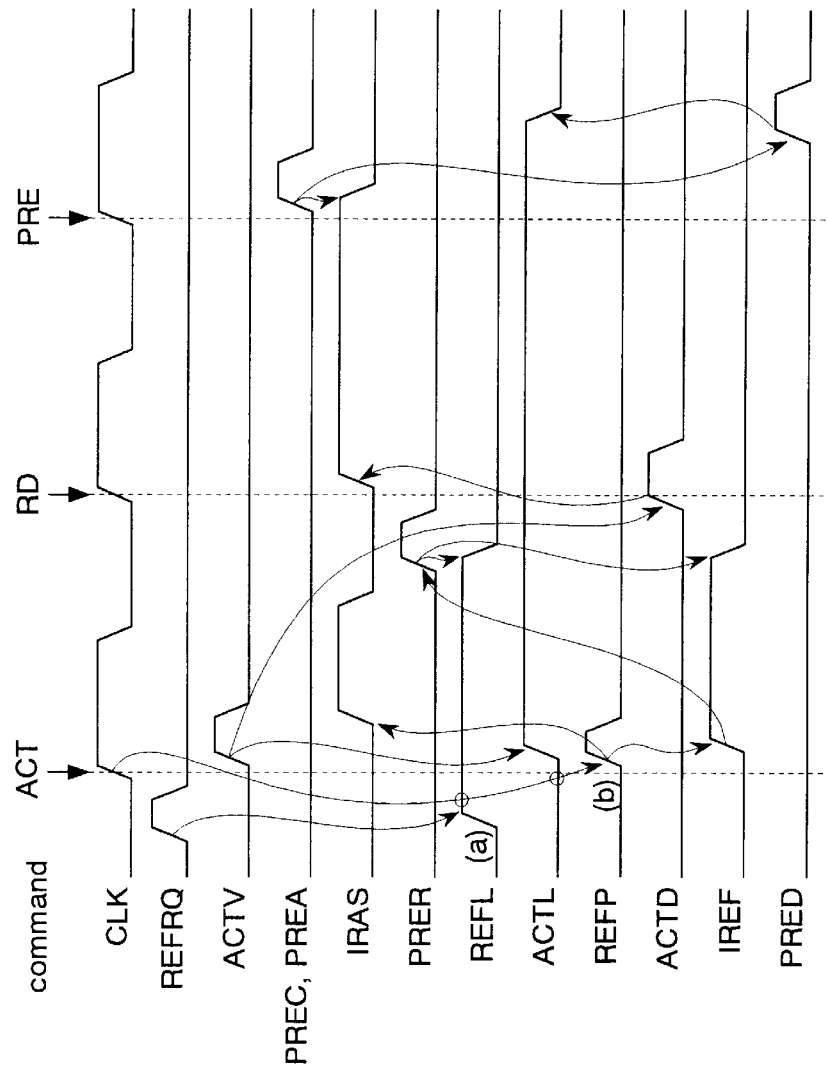
FIG. 12 is a timing chart showing a read operation in the fourth embodiment.

FIG. 12 shows the operation timing of the refresh control circuit 70 in a read operation when a refresh request occurs internally just before the reception of the active command ACT. In this example, the timing of the signals is almost the same as in FIG. 5 described above except that a refresh operation is performed in synchronization with the clock signal CLK.

Initially, the reception of the refresh request turns the refresh latched signal REFL to high level (FIG. 12(a)). The active command ACT is supplied in synchronization with the rise of the clock signal CLK. Here, the active latched signal ACTL and the refresh pulse REFP are at low level (non-reset state), and the latch 76 is in operation. The latch 76 latches the refresh latched signal REFL of high level in synchronization with the rising edge of the clock signal CLK, and turns the refresh pulse REFP to high level. The latch 76 is reset by the refresh pulse REFP that is fed back through the delay circuit 78 and the OR gate 80. This consequently generates the refresh pulse REFP of pulse form (FIG. 12(b)). Then, the refresh control circuit 70 operates as in FIG. 5, thereby performing a refresh operation, a read operation, and a post-refresh precharge operation in succession.

Figure 13:
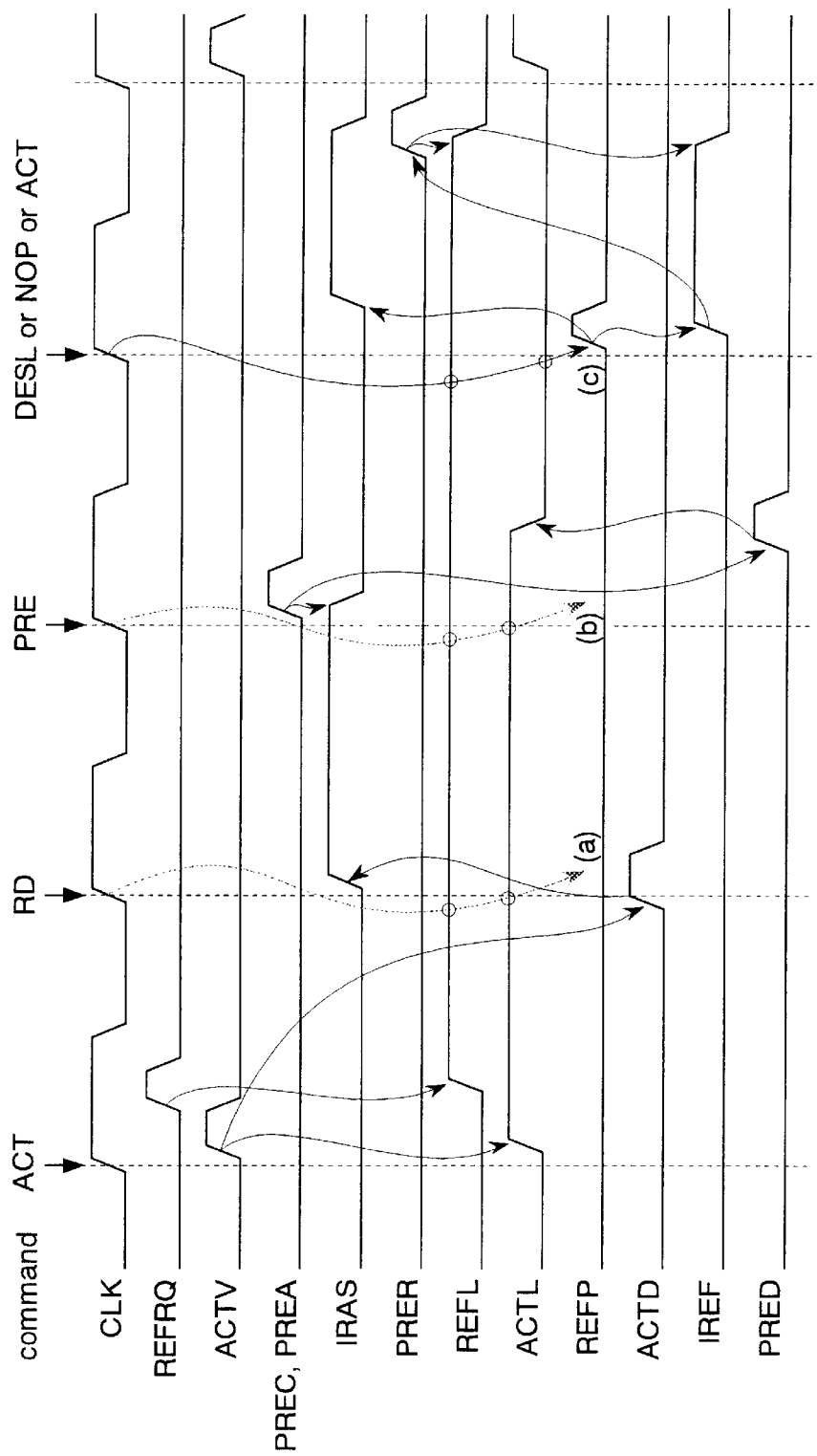
FIG. 13 is another timing chart showing a read operation in the fourth embodiment.

FIG. 13 shows the operation timing of the refresh control circuit 70 in a read operation when a refresh request occurs internally after the reception of the active command ACT. In this example, the timing of the signals is almost the same as in FIG. 6 described above except that a refresh operation is performed in synchronization with the clock signal CLK.

The latch 76 is kept reset over the high-level period of the active latched signal ACTL, and thus incapable of latching the refresh latched signal REFL (FIGS. 13(a, b)). Therefore, the latch 76 generates the refresh pulse REFP in synchronization with the rise of the clock signal CLK that comes after the inactivation of the active latched signal ACTL (FIG. 13(c)). Here, for example, a DESL command, a NOP command, or an active command ACT is supplied in synchronization with the clock signal CLK. Then, a refresh operation is performed. The refresh pulse REFP is activated at predetermined timing after the rise of the clock signal CLK, so that the refresh operation is performed at the same timing as in FIG. 12 described above.

This embodiment can offer the same effects as those obtained from the first and second embodiments described above. Moreover, in this embodiment, commands such as the active command ACT are supplied in synchronization with the clock signal CLK. The refresh control circuit 70 performs refresh operations in synchronization with the clock signal CLK. This facilitates the timing design of the circuits necessary for refresh control.

Figure 14:
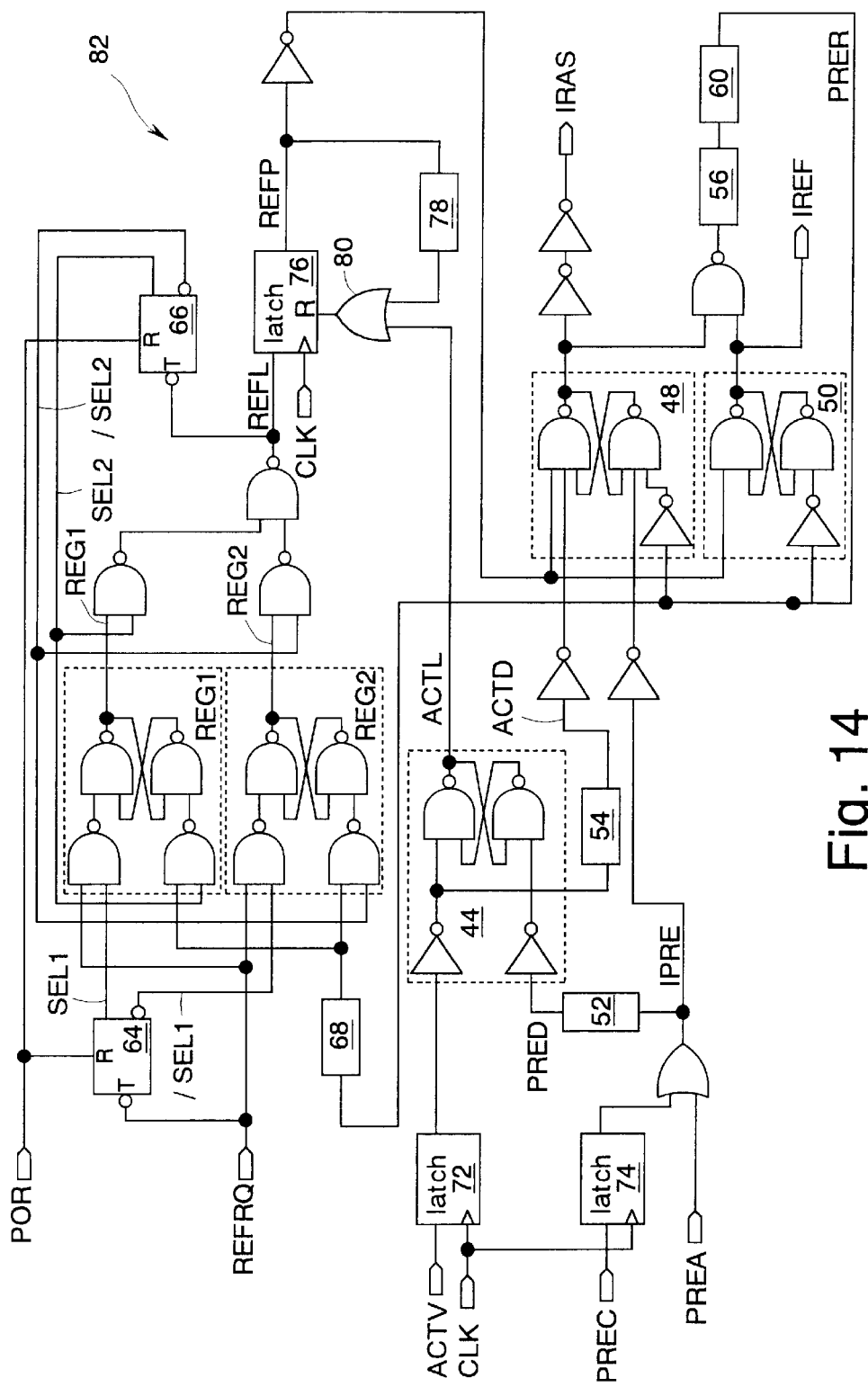
FIG. 14 is a circuit diagram showing a refresh control circuit according to a fifth embodiment of the present invention.

FIG. 14 shows a fifth embodiment of the semiconductor memory and the method of operating a semiconductor memory in the present invention. The same circuits and signals as those described in the third and fourth embodiments will be designated by identical reference numbers or symbols. Detailed description of these circuits and signals will be omitted here.

This embodiment includes a refresh control circuit 82 that differs from the refresh control circuit 12 of the first embodiment. The other configuration is identical to that of the first embodiment.

The refresh control circuit 82 has latches 72, 74, and 76, a delay circuit 78, and an OR gate 80 which are the same as those of the fourth embodiment. It also has registers REG1 and REG2, flip-flops 44, 48, and 50, delay circuits 52, 54, 56, and 68, and a pulse generator 60 which are the same as those of the third embodiment, along with a plurality of logic gates.

The registers REG1 and REG2, the flip-flops 44, 48, and 50, the delay circuits 52, 54, 56, and 68, the pulse generator 60, and the logic gates are connected as in the third embodiment. The latches 72, 74, and 76, the delay circuit 78, and the OR gate 80 are connected as in the fourth embodiment.

In this embodiment, as in the third embodiment, two refresh requests are held individually by the registers REG1 and REG2. As in the fourth embodiment, the refresh pulse REFP is generated in synchronization with the rising edge of the clock signal CLK. Then, memory operations are performed in almost the same timing as that shown in FIGS. 8 through 10 described above.

This embodiment can offer the same effects as those obtained from the third and fourth embodiments described above.

Figure 15:
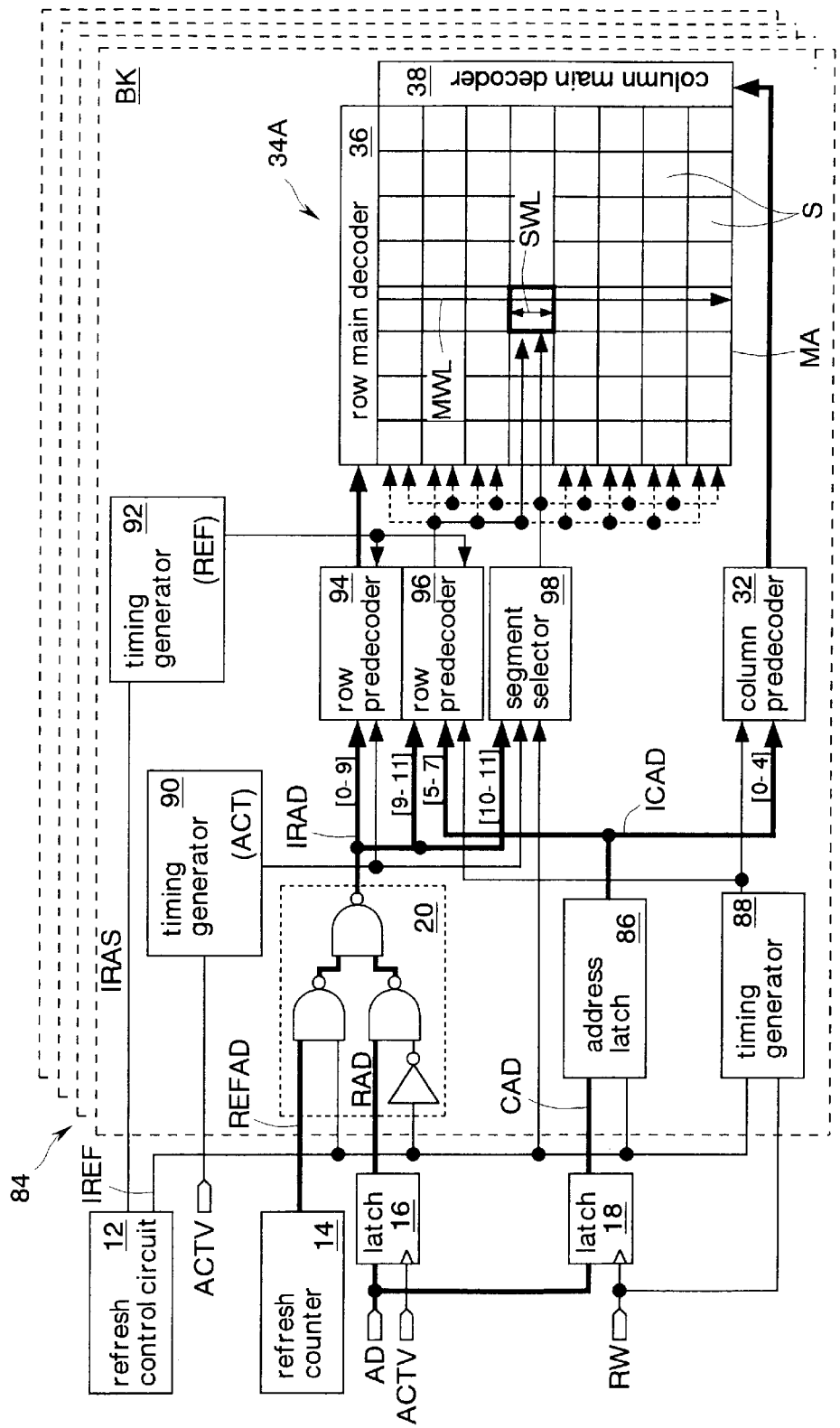
FIG. 15 is a block diagram showing a sixth embodiment of the present invention.

FIG. 15 shows a six embodiment of the semiconductor memory and the method of operating a semiconductor memory in the present invention. The same circuits and signals as those described in the first embodiment will be designated by identical reference numbers or symbols. Detailed description of these circuits and signals will be omitted here.

This semiconductor memory is formed as a 64-Mbit SDRAM 84 on a silicon substrate by using CMOS processes. For the sake of excellent usability, the SDRAM 84 has the function of refreshing its memory cells internally and automatically. On this account, users can design system boards to mount the SDRAM on without any consideration of refresh.

The SDRAM 84 has the same terminal configuration as that of ordinary 64-Mbit SDRAMs. That is, the SDRAM 84 has twelve address terminals for receiving a 12-bit row address signal and an 8-bit column address signal, two bank select terminals, and sixteen data input/output terminals.

The SDRAM 84 has a refresh control circuit 12, a refresh counter 14, latches 16 and 18, and four banks BK. The banks BK each include an address selector 20, an address latch 86, timing generators 88, 90, and 92, row predecoders 94 and 96, a segment selector 98, a column predecoder 32, and a memory core 34A. The refresh control circuit 12, the refresh counter 14, the latches 16 and 18, the address selectors 20, and the column predecoders 32 are identical to those of the first embodiment. The memory cores 34A each have a memory array MA which includes a row main decoder 36, a column main decoder 38, and a plurality of segments S arranged vertically and horizontally. In this example, each single segment S consists of 512 k memory cells. Main-word lines MWL each are electrically connected to a plurality of sub-word lines SWL via transistors. The sub-word lines SWL are connected to the gates of the transfer transistors in the memory cells.

The address latch 86 latches a column address signal CAD output from the latch 18 when the internal refresh signal IREF is inactivated, and output the latched signal as an internal column address signal ICAD.

The timing generator 88 receives a read/write command signal RW and an internal refresh signal IREF, and generate timing signals for operating the column predecoder 32 and timing signals for operating the row predecoder 96. That is, when a read command RD, a write command WR, and a refresh command (a refresh request occurring internally) are supplied, the row predecoder 96 and the column predecoder 32 are put into operation.

The timing generator 90 receives an active command signal ACTV, and generate timing signals for operating the row predecoder 94 and the segment selector 98. That is, when the active command ACT is supplied, the row predecoder 94 and the segment selector 98 are put into operation.

The timing generator 92 receives an internal row address strobe signal IRAS, and generate timing signals for operating the row predecoders 94 and 96. That is, as will be described later, the row predecoders 94 and 96 are put into operation when a refresh request occurs.

The row predecoder 94 decodes internal row address signals IRAD (IRAD0–9 shown in FIG. 18 to be described later) when supplied with the active command ACT, and decode an internal row address signal IRAD (IRAD0–8 shown in FIG. 18) when a refresh request occurs. The row predecoder 94 outputs the decoding signal to the row main decoder 36. The row predecoder 96 decodes an internal row address signal IRAD (IRAD9–11 shown in FIG. 18) in a refresh operation, and decode an internal column address signal ICAD (ICAD5–7 shown in FIG. 18) in read and write operations. The row predecoder 96 outputs the decoding signal to the memory array MA.

The segment selector 98, when supplied with the active command ACT, decodes an internal row address signal IRAD (IRAD10–11 shown in FIG. 18) and select a segment S. Moreover, the segment selector 98, at the time of occurrence of a refresh request, select all the segments which align in the vertical direction of the diagram irrespective of the internal row address signal IRAD. The column predecoder 32, in read and write operations, decodes the internal column address signal ICAD (ICAD0–4 shown in FIG. 18) and outputs the decoded signal to the column main decoder 38.

Figure 16:
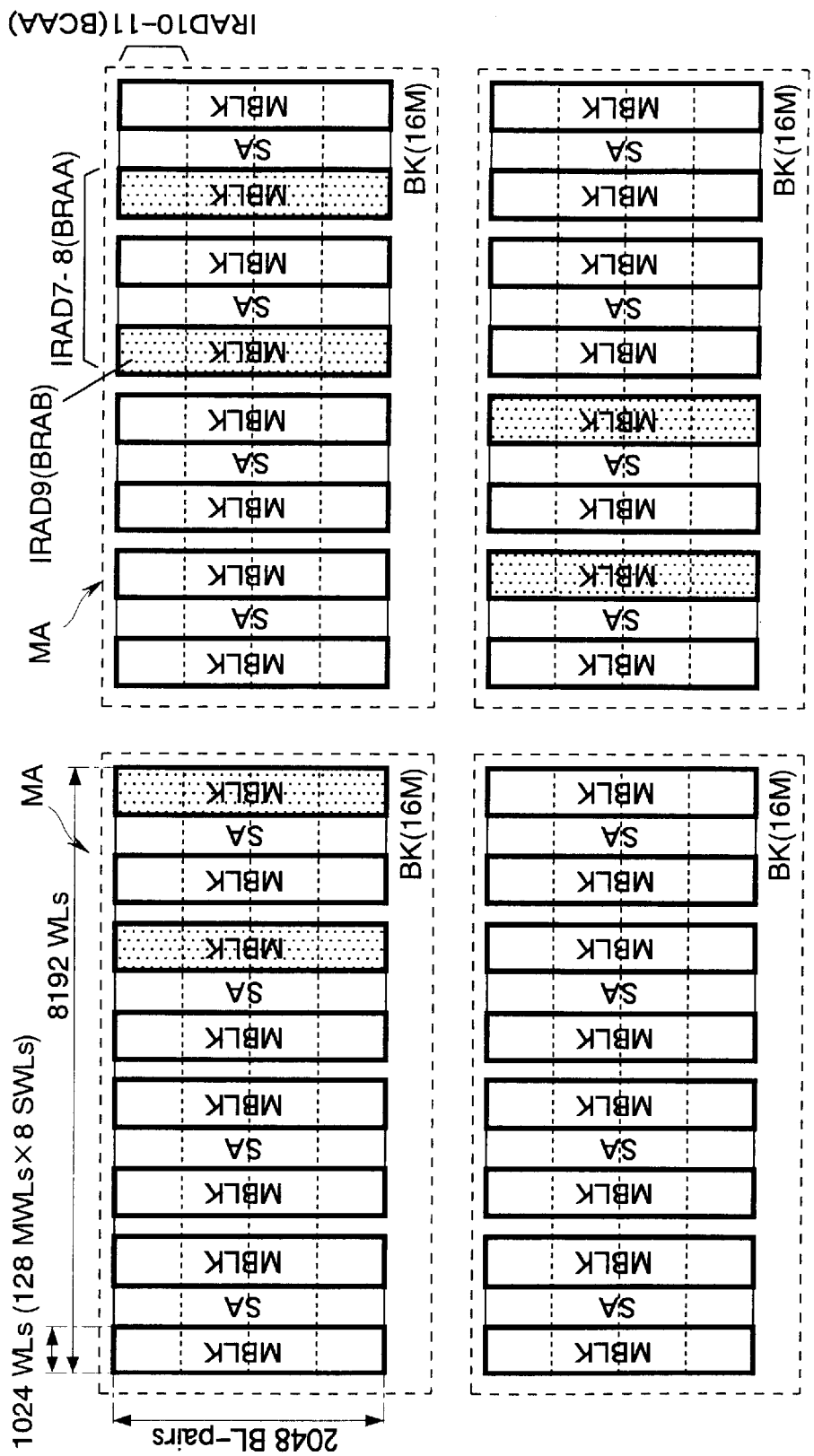
FIG. 16 is a block diagram showing the details of the memory arrays shown in FIG. 15.

FIG. 16 shows the details of the memory arrays MA shown in FIG. 15. On each bank BK, the memory array MA has eight memory blocks MBLK and four sense amplifier rows composed of a plurality of sense amplifiers SA. Each sense amplifier is shared between two memory blocks MBLK on both sides.

As shown on the top left bank BK in the diagram, each single memory block MBLK has 1024 word lines WL which are arranged in the horizontal direction of the diagram and 2048 bit line pairs which are arranged in the vertical direction of the diagram. The word lines WL are composed of 128 main-word lines MWL and eight sub-word lines SWL that branch off from every main-word line MWL.

Figure 18:
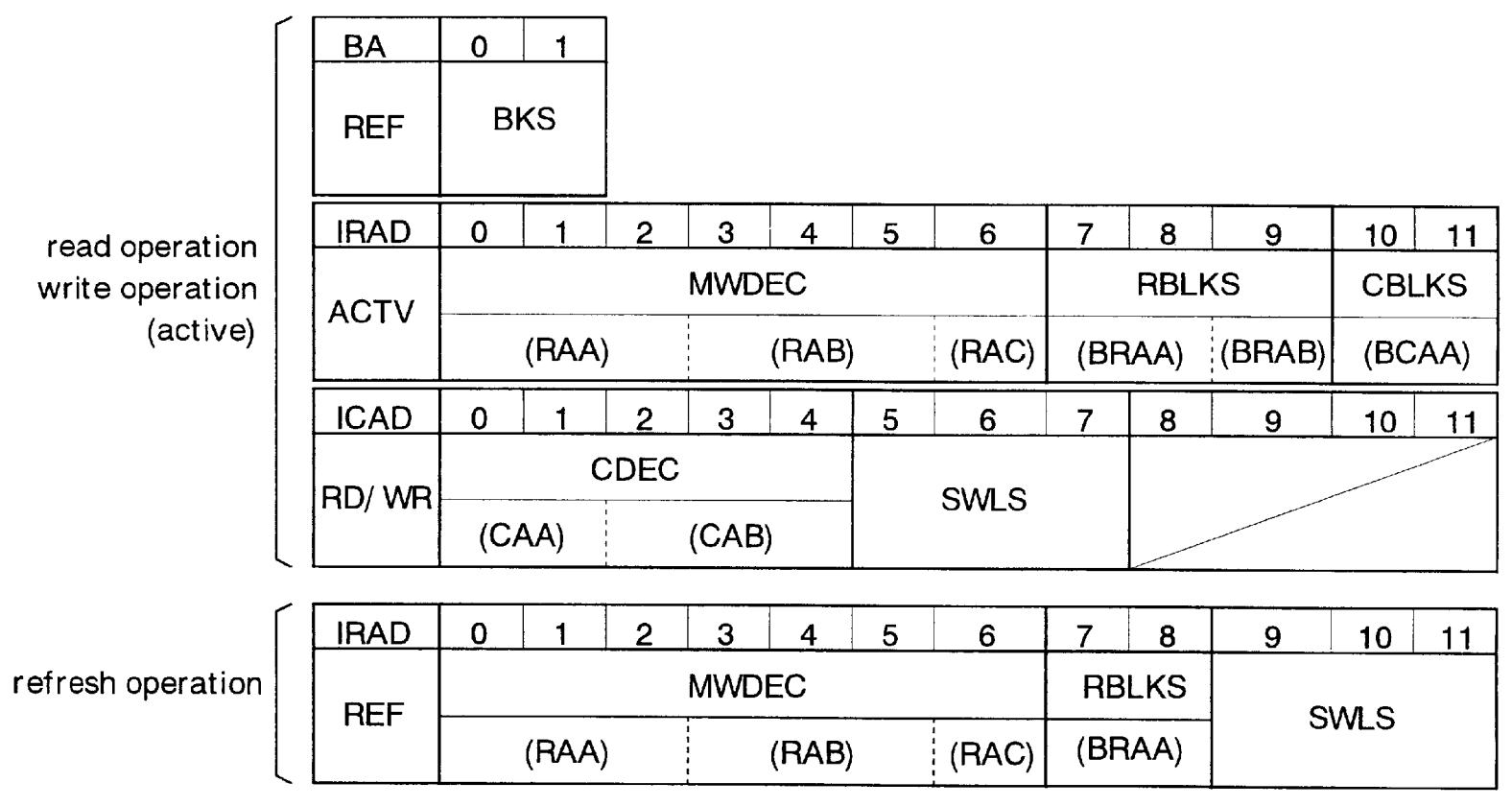

As shown on the top right bank BK in the diagram, each memory array MA has two memory blocks MBLK astride a single memory block MBLK that are selected by the internal row address signal IRAD7–8 (row block address BRAA in FIG. 18). That is, as shown shadowed in the diagram, two memory blocks on the same sides of sense amplifier rows (for example, the left sides in the diagram) are selected. Moreover, in each of the memory blocks MBLK selected, a single main-word line MWL is selected by the internal row address signal IRAD0–6.

From between the two memory blocks MBLK selected by the internal row address signal IRAD7–8, either one is further selected by the internal row address signal IRAD9 (row block address BRAB in FIG. 18). The selection of the memory blocks MBLK and the selection of the main-word lines MWL through the use of the internal row address signal IRAD0–9 are effected by the row predecoder 94 shown in FIG. 15. Incidentally, in refresh operations, the row predecoder 94 ignores the internal row address signal IRAD9. Therefore, a refresh operation is performed on the two main-word lines in the two memory blocks MBLK shown shadowed in the diagram.

In read and write operations, the internal row address signal IRAD10–11 (column block address BCAA in FIG. 18) selects a quarter of the area from the single memory block MBLK selected. That is, within the quarter area of the memory block MBLK, the internal row address signal IRAD10–11 releases the bit lines from a precharge operation and activates the sense amplifiers SA.

Figure 17:
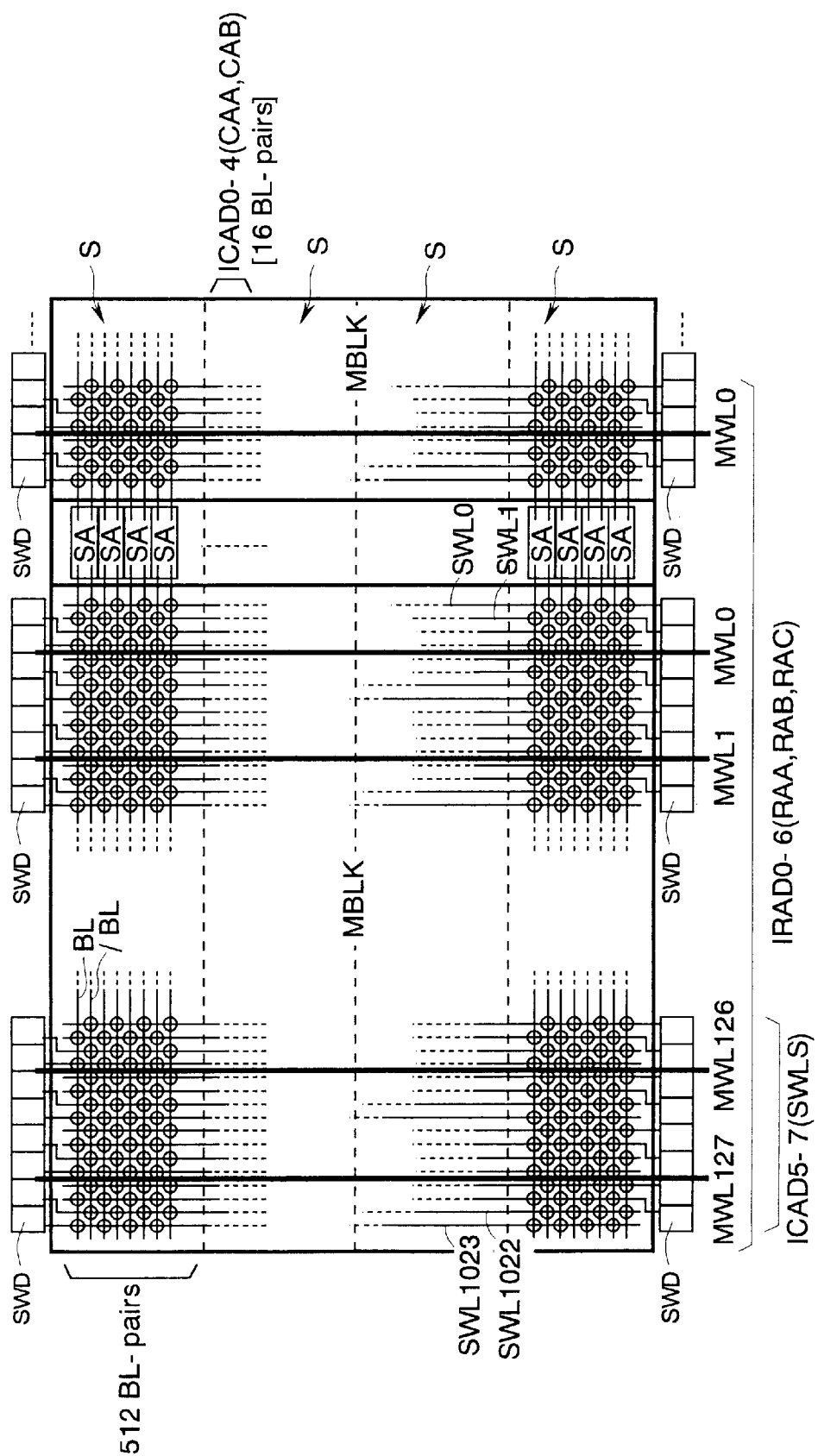
FIG. 17 is a block diagram showing the details of memory blocks shown in FIG. 16.

FIG. 17 shows the details of memory blocks MBLK shown in FIG. 16. Each memory block MBLK includes 128 main-word lines MWL0–127 and 1024 sub-word lines SWL0–1023 which are laid along the vertical direction of the diagram, and 2048 bit line pairs BL and /BL which are laid along the horizontal direction of the diagram. Memory cells (small circles in the diagram) are formed on the intersections of the sub-word lines SWL and the bit lines BL (or /BL). For example, when a sub-word line SWL is activated to select memory cells in a read operation, data is read out to either ones of bit line pairs BL and /BL. The others of the bit line pairs BL and /BL function as references for amplifying the data.

Each single main-word line MWL is connected to four sub-word decoders SWD arranged on either side (top, bottom in the diagram) of the memory block MBLK. Then, each main-word line MWL branches into eight sub-word lines SWL through the sub-word decoders SWD. The main-word line MWL is selected, as mentioned above, by the internal row address signal IRAD0–6 (row addresses RAA, RAB, and RAC). The sub-word line SWL is selected by the internal column address signal ICAD5–7 (sub-word select SWLS).

The sense amplifiers SA are connected to the bit line pairs BL and /BL in the memory blocks MBLK on both sides, the right and left in the diagram. The connections between the sense amplifiers SA and the bit line pairs BL and /BL on both sides, and the activation of the sense amplifiers SA are controlled, as mentioned above, by the internal row address signal IRAD10–11 with respect to each of the segments S which are the quarter areas of the memory blocks MBLK. From among the 512 bit line pairs BL, /BL and 512 sense amplifiers SA that are activated by the internal row address signal IRAD10–11, sixteen each are selected by the internal column address ICAD0–4 (column addresses CAA and CAB). That is, data corresponding to sixteen data input/output terminals is input/output to/from the memory cells.

FIG. 18 shows the uses of address signals within the SDRAM. The SDRAM receives a bank address signal BA0–1 through the bank select terminals, and receives a row address signal RAD0–11 (internal row address signal IRAD0–11) and a column address signal CAD-07 (internal column address signal ICAD0–7) through the address terminals, to perform a read or write operation. The SDRAM also performs a refresh operation under a refresh address REFAD (internal row address signal IRAD0–11) which is generated by the refresh counter 14 shown in FIG. 15.

The row address signal RAD0–11 (internal row address signal IRAD0–11) to be supplied along with the active command ACT consists of IRAD0–6 (MWDEC), IRAD7–9 (RBLKS), and IRAD10–11 (CBLKS). IRAD0–6 (MWDEC) and IRAD7–9 (RBLKS) are supplied to the row predecoder 94 shown in FIG. 15, and IRAD10–11 (CBLKS) to the segment selector 98.

As mentioned above, the internal row address signal IRAD0–6 (MWDEC) selects one out of 128 main-word lines in a memory block MBLK. The internal row address signal IRAD7–8 (BRAA of RBLKS) selects two out of eight memory blocks MBLK. The internal row address signal IRAD9 (BRAB of RBLKS) selects one out of two memory blocks MBLK selected. The internal row address signal IRAD10–11 (CBLKS) selects a segment S which is a quarter area of the memory block MBLK selected.

The column address signal CAD0–7 (internal column address signal ICAD0–7) to be supplied along with the read command RD or the write command WR consists of the internal column address signal ICAD0–4 (CDEC) and the internal column address signal ICAD5–7 (SWLS). The internal column address signal ICAD0–4 (CDEC) is supplied to the column predecoder 32 shown in FIG. 15, and the internal column address signal ICAD5–7 (SWLS) to the column predecoder 96.

As mentioned above, the internal column address signal ICAD0–4 (CDEC) selects sixteen out of both 512 bit line pairs BL, /BL and 512 sense amplifiers SA in a segment S selected. The internal column address signal ICAD5–7 (SWLS) selects one out of eight sub-word lines SWL corresponding to a main-word line MWL selected.

This embodiment is characterized in that the row address signal RAD to be supplied along with the active command ACT selects a segment S, and the column address signal CAD to be supplied along with the read command RD (or the write command WR) selects a sub-word line SWL. In particular, since a segment S is selected in response to the row address signal RAD, the operation of releasing the connections between unused bit line pairs BL, /BL and sense amplifiers SA and the operation of releasing the precharge of the bit line pairs BL, /BL can be started before the supply of the read command RD (or write command WR). As a result, read and write operations can be performed faster than in the first embodiment.

Figure 19:
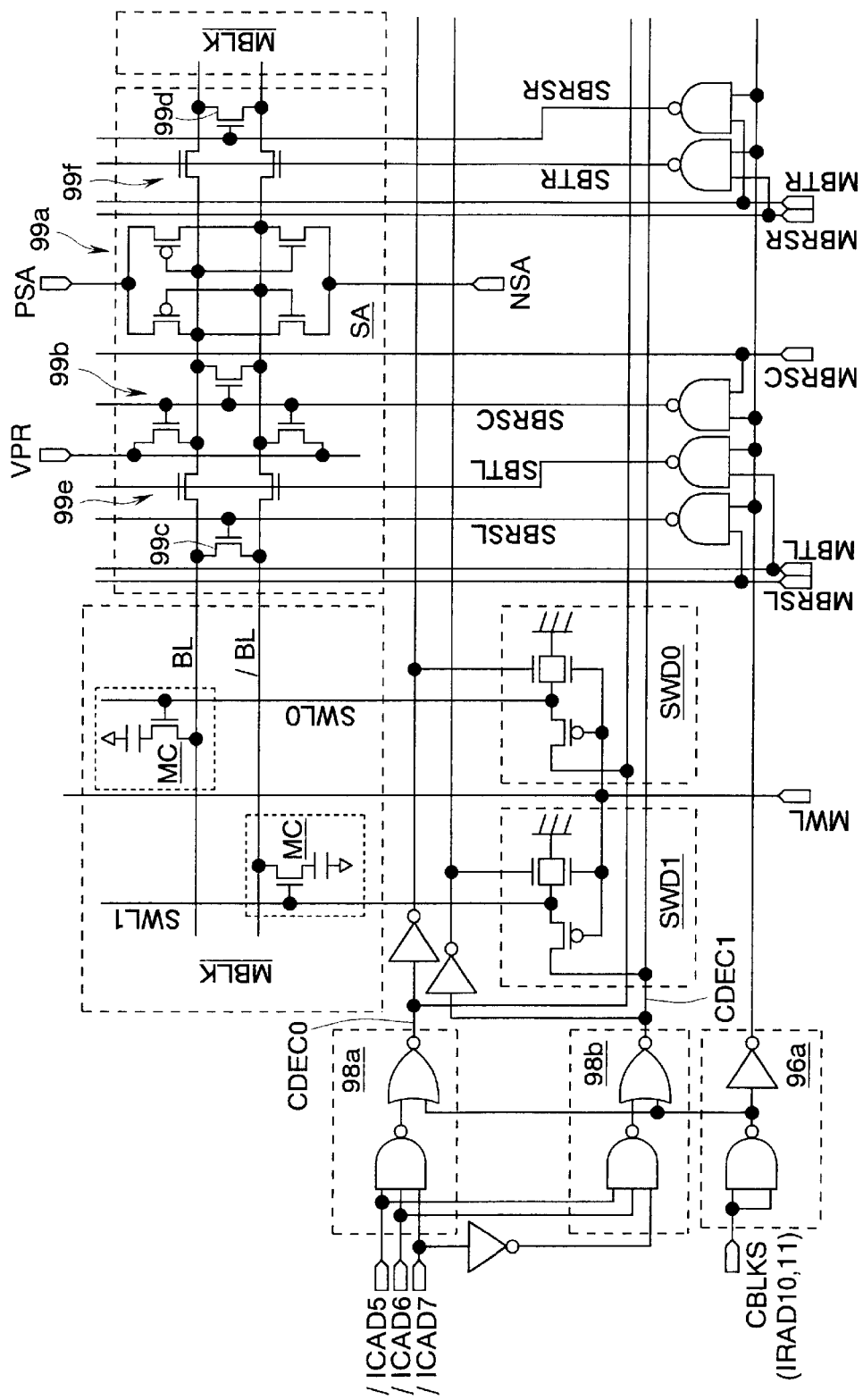
FIG. 19 is a circuit diagram showing the details of sub-word decoders and a sense amplifier shown in FIG. 17.

FIG. 19 shows the details of sub-word decoders SWD and a sense amplifier SA shown in FIG. 17, along with their peripheral circuits. The sub-word decoders SWD (SWD0, 1) each include two nMOS transistors connected in parallel and a pMOS transistor connected in series with these nMOS transistors. The gate of one of the nMOS transistors and the gate of the pMOS transistor are connected to a main-word line MWL. The gate of the other nMOS transistor and the source of the pMOS transistor receive decoding signals CDEC0, 1 of the internal column address signal ICAD5–7 (in this example, negative-logic internal row address signal /ICAD5–7), respectively, which are generated by a decoding circuit 98a. The decoding circuit 98a is activated when a decoding signal of the internal row address signal IRAD10–11, generated by a decoding circuit 96a, is at high level. The sources of the nMOS transistors are connected to a ground line. The connection node between the nMOS transistors and the pMOS transistor is connected to a sub-word line SWL (SWL0, 1).

In each of the sub-word decoders SWD described above, the pMOS transistor turns on and either one of the nMOS transistors turns off when the main-word line MWL is selected and turned to low level. Then, the decode signal CDEC0 (or CDEC1) of high level, output from the decoding circuit 98a, is transmitted to the sub-word line SWL0 (or SWL1). That is, the column address signal CAD selects the sub-word line SWL. The selection of the sub-word line SWL turns on the transfer transistor of the memory cell MC so that the charge retained in the capacitor is transmitted onto the bit line BL (or /BL).

The sense amplifier SA includes a latch 99a, a bit line control circuit 99b, nMOS transistors 99c and 99d, and bit line selecting switches 99e and 99f. The latch 99a has two CMOS inverters whose inputs and outputs are connected to each other. The latch 99a is activated in response to activation signals PSA and NSA. The bit line control circuit 99b is composed of three nMOS transistors for equalizing the bit line pair in the sense amplifier SA, or supplying the same with a precharging voltage VPR. The nMOS transistor 99c equalizes the bit line pair BL, /BL of the memory block MBLK on the left in the diagram. The nMOS transistor 99d equalizes the bit line pair BL, /BL of the memory block MBLK on the right in the diagram. The bit line selecting switch 99e is composed of two nMOS transistors for connecting the bit line pair BL, /BL of the memory block MBLK on the left in the diagram to the latch 99a. The bit line selecting switch 99f is composed of two nMOS transistors for connecting the bit line pair BL, /BL of the memory block MBLK on the right in the diagram to the latch 99.

The bit line control circuit 99b sets the bit line pair BL, /BL to the precharging voltage VPR when a sub-bit line reset signal SBRSC is at high level. The sub-bit line reset signal SBRSC turns to high level in response to a main-bit line reset signal MBRSC of low level, thereby precharging the bit line pair BL, /BL.

The nMOS transistor 99c equalizes the bit line pair BL, /BL when a sub-bit line reset signal SBRSL is at high level. The sub-bit line reset signal SBRSL turns to high level in response to a main-bit line reset signal MBRSL of low level, thereby equalizing the bit line pair BL, /BL.

Similarly, the nMOS transistor 99d equalizes the bit line pair BL, /BL when a sub-bit line reset signal SBRSR is at high level. The sub-bit line reset signal SBRSR turns to high level in accordance with a main-bit line reset signal MBRSR of low level, thereby equalizing the bit line pair BL, /BL.

The bit line selecting switch 99e turns on in response to the activation (high level) of a sub-bit line transfer signal SBTL, thereby establishing connection between the bit line pair BL, /BL and the latch 99a. The sub-bit line transfer signal SBTL changes to high level in accordance with a main-bit line transfer signal MBTL of low level, turning on the bit line selecting switch 99e.

Similarly, the bit line selecting switch 99f turns on in response to the activation (high level) of a sub-bit line transfer signal SBTR, thereby establishing connection between the bit line pair BL, /BL and the latch 99a. The sub-bit line transfer signal SBTR changes to high level in response to a main-bit line transfer signal MBTR of low level, turning on the bit line selecting switch 99f.

The main-bit line reset signal MBRSC is activated in accordance with the row address signal RAD7–8. The main-bit line reset signals MBRSL, MBRSR and the main-bit line transfer signals MBTL, MBTR are activated in accordance with the row address signal RAD7–9. More specifically, when the main-bit line reset signal MBRSC and the main-bit line reset signal MBRSL (or MBRSR) corresponding to the memory block MBLK to operate are activated, the equalization of the bit lines BL and /BL is released. Then, the main-bit line transfer signal MBTL (or MBTR) that corresponds to the not-operating one out of the pair of memory blocks MBLK astride the sense amplifier SA is activated to release the connection between the bit lines BL, /BL and the latch 99a.

The sub-bit line reset signals SBRSC, SBRSL, and SBRSR, and the sub-bit line transfer signals SBTL and SBTR are selected in accordance with the row address signal IRAD10–11. That is, the signal lines of these signals are laid with respect to each of the segments S which are the quarter areas of the memory blocks MBLK. Incidentally, all the decoding signals of the internal row address signal IRAD10–11, generated by the decoding circuit 96a, are turned to high level in refresh operations. Therefore, during refresh operations, all the segments S in the memory block MBLK are selected. This allows all the memory cells to be refreshed by fewer refresh requests.

Figure 20:
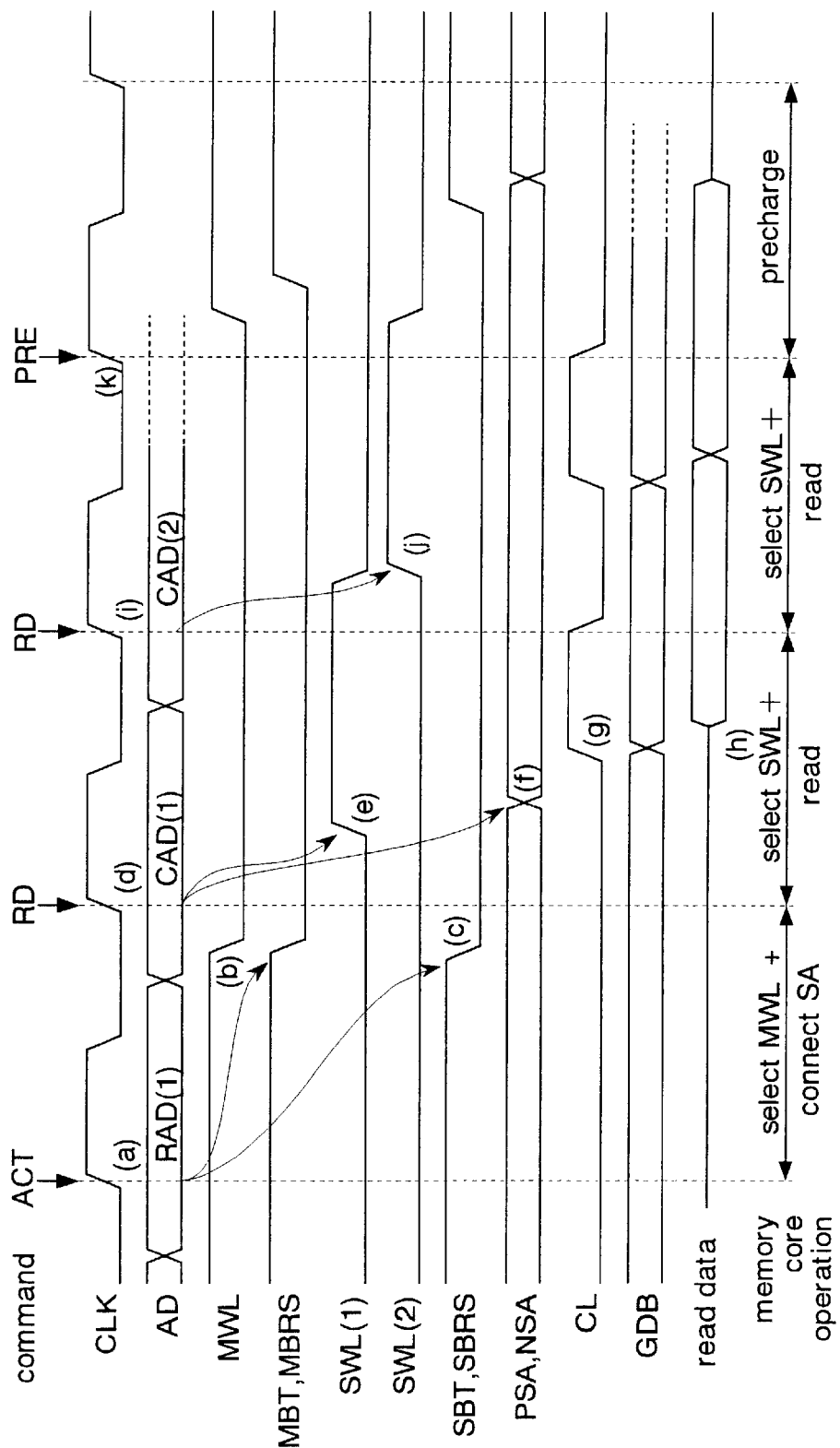
FIG. 20 is a timing chart showing read operations in the sixth embodiment.

FIG. 20 shows read operations at a lower clock frequency. In this example, two read commands RD are supplied in succession after the active command ACT. Then, the precharge command PRE is supplied. Detailed description will be omitted of the same operations as those of FIG. 2 above.

Initially, the active command ACT and a row address signal RAD(1) are supplied in synchronization with the rising edge of the clock signal CLK (FIG. 20(a)). In accordance with the internal row address signal IRAD0–9, main-word lines MWL are selected (turned to low level). The main-bit line transfer signals MBT (MBTL, MBTR) and the main-bit line reset signals MBRS (MBRSC, MBRSL, MBRSR) change to low level (FIG. 20(b)).

In this embodiment, the sub-bit line transfer signals SBT (SBTL, SBTR) and the sub-bit line reset signals SBRS (SBRSC, SBRSL, SBRSR) are also selected in accordance with the internal row address signal IRAD10–11 (FIG. 20(c)). Accordingly, the bit line control circuit 99b, the nMOS transistors 99c and 99d, and the bit line selecting switches 99e and 99f shown in FIG. 19 start their operations earlier than heretofore, or before the reception of the read command RD. That is, the memory block MBLK and sense amplifiers SA not performing the read operation (or write operation) are disconnected to each other.

The read command RD and a column address signal CAD(1) are supplied in synchronization with the rise of the next clock signal CLK (FIG. 20(d)). Sub-word lines SWL are selected in accordance with the internal column address signal ICAD5–7 (FIG. 20(e)). That is, even in this embodiment, the sub-word lines SWL are activated by using not only the row address signal RAD but also the column address signal CAD. Then, the activation signals PSA and NSA in the segment S selected by the internal row address signal IRAD7–11 are activated to activate the sense amplifiers SA (FIG. 20(f)).

Due to the selection of the sub-word lines SWL, data is read from the memory cells MC to the bit lines BL (or /BL), and amplified by the sense amplifiers SA. Furthermore, a column line select signal CL is selected in accordance with the internal column address ICAD0–4 (FIG. 20(g)) so that column selecting switches (not shown) are turned on to establish connections between 16 bit line pairs BL, /BL and common data bus lines (16 bits). Then, the read data is output to exterior (FIG. 20(h)).

The read command RD and a column address signal CAD(2) are supplied in synchronization with the rising edge of the next clock signal CLK (FIG. 20(i)). Sub-word lines SWL are selected in accordance with the internal column address signal ICAD5–7 (FIG. 20(j)). Then, a so-called page read operation is performed as described above. The page operation is effected by the column address signal CAD0–4 selecting 16 bits out of the data that is amplified by the 512 sense amplifiers SA activated.

The precharge command PRE is supplied in synchronization with the rising edge of the next clock signal CLK (FIG. 20(k)). The precharge command PRE inactivates the main-word lines MWL, the sub-word lines SWL, the main-bit line transfer signal MBT, the main-bit line reset signal MBRS, the sub-bit line transfer signal SBT, the sub-bit line reset signal SBRS, and the activation signals PSA and NSA of the sense amplifiers SA, and precharges the bit lines BL and /BL.

In write operations, although not particularly shown in the drawings, main-word lines MWL and sub-word lines SWL are selected in the same timing as in read operations, followed by the selection of the bit line transfer signals MBT, SBT and the bit line reset signals MBRS, SBRS.

In refresh operations, two main-word lines MWL in two memory blocks MBLK on each of the four banks BK are activated. The sub-word lines SWL in the corresponding eight segments S are activated at the same time. That is, 16 kbits of memory cells MC (512 bits×8 segments×4 banks) are refreshed at a time. Incidentally, refresh may be performed segment by segment or bank BK by bank BK if a reduction is intended of the peak current in refresh operations and as long as the period necessary for refreshing all the memory cells (typically, refresh time tREF) is met.

Figure 21:
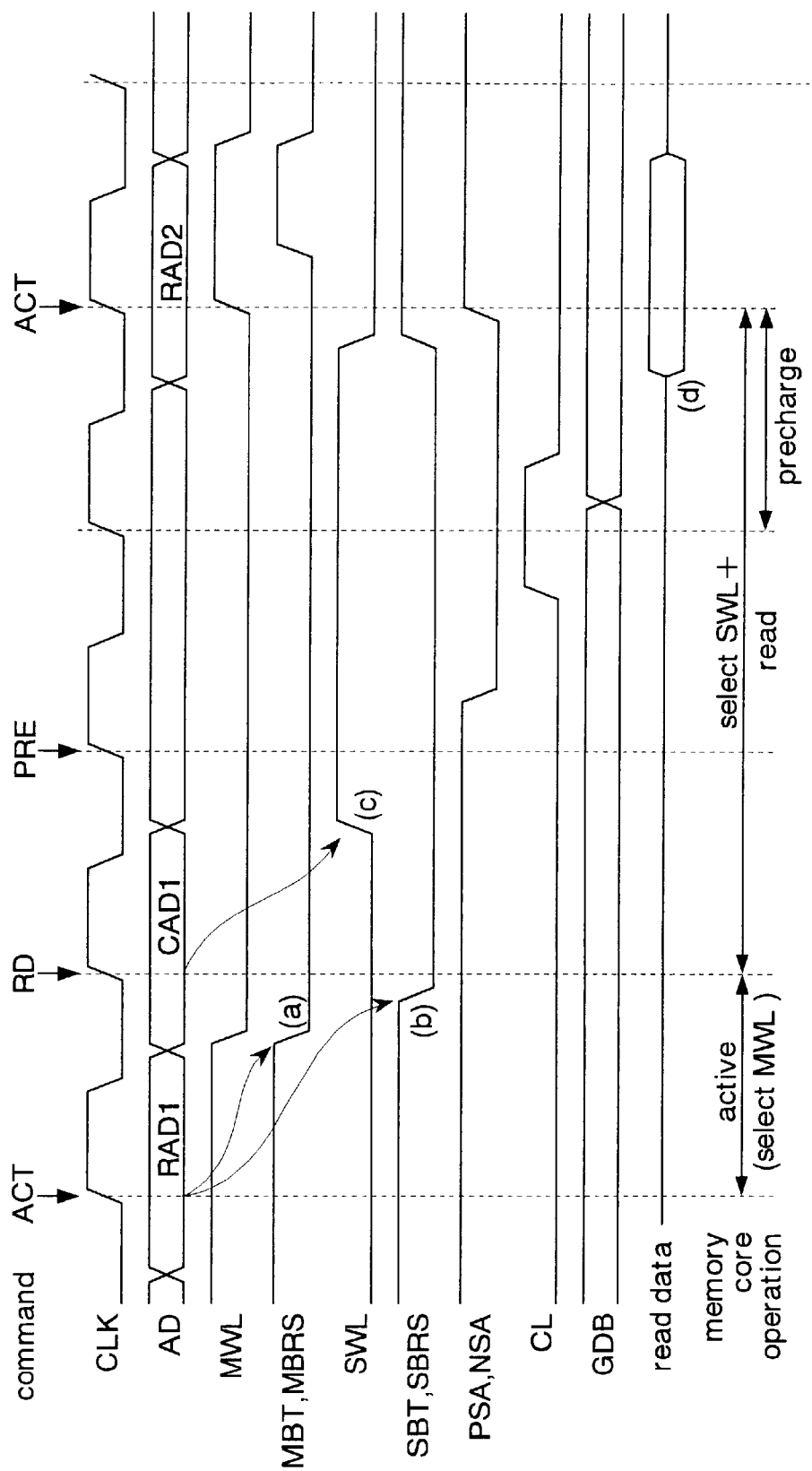
FIG. 21 is another timing chart showing a read operation in the sixth embodiment.

FIG. 21 shows read operations at a higher clock frequency. In this example, the read command RD and the precharge command PRE are supplied in succession after the active command ACT. Then, at the next clock but one, the active command ACT is supplied again.

The basic operation timing of FIG. 21 is identical to that of FIG. 20. That is, the bit line transfer signals MBT, SBT and the bit line reset signals MBRS, SBRS are selected in accordance with the row address signal RAD1 which is supplied along with the active command ACT (FIGS. 21(a), (b)). Sub-word lines SWL are selected in accordance with the column address signal CAD1 which is supplied along with the read command RD (FIG. 21(c)).

Since higher clock frequencies make the operation of the internal circuits relatively slower, the read data cannot be output within the clock cycle at which the read command RD is supplied. In this example, the read data is output in synchronization with the rising edge of the third clock signal CLK from the reception of the read command RD (FIG. 21(d)).

As described above, this embodiment can offer the same effects as those obtained from the first embodiment described above. Moreover, in this embodiment, some of the circuits for controlling memory operations (read operations and write operations) are operated in accordance with the row address signal RAD which is supplied along with the active command ACT. Accordingly, the circuits which used to start operation in response to the read command RD or the write command WR can be operated in advance, to perform a read operation or write operation at higher speed. That is, it is possible to achieve a speedup while maintaining the low-power-consumption characteristic.

More specifically, any of a plurality of memory blocks MBLK is selected in accordance with the row address signal RAD7–9 which is supplied along with the active command ACT to be supplied at the beginning of a memory operation. Selecting a memory block MBLK at an earlier time of memory operation can decrease the circuits to start operation in response to the subsequent read command RD (or write command WR). As a result, it is possible to reduce the time that elapses from the supply of the active command ACT to the completion of the read operation (or write operation).

In accordance with the row address signal RAD10–11 which is supplied along with the active command ACT, the bit line selecting switches 99e and 99f are selected with respect to each segment S. Therefore, the connections between the bit lines BL, /BL of not-operating memory blocks MBLK and sense amplifiers SA can be released at an earlier time of memory operation. As a result, it is possible to reduce the time that elapses from the supply of a first command to the completion of a read or write operation. Besides, since the connections between the bit lines BL, /BL and the sense amplifiers SA are established by segment S, the number of circuits to be operated in read and write operations can be decreased in number, with a reduction in the operating power consumption.

In refresh operations, the bit line selecting switches 99e and 99f in all the segments in a memory block MBLK are selected at the same time. Since the number of segments S to operate during refresh is made greater than that of segments to operate in read and write operations, it is possible to reduce the number of times of refresh necessary for refreshing all the memory cells MC. Accordingly, the refresh intervals can be extended so that read and write operations increase in ratio within a predetermined period. This means an improved I/O bus occupation rate (data transmission rate).

In refresh operations, the main-word lines MWL and the sub-word lines SWL are selected in accordance with the refresh address REFAD which corresponds to the active command ACT. Unlike read and write operations, refresh operations can be started in response to the active command ACT. This allows refresh operations to be performed faster than read and write operations. Accordingly, within a predetermined period, the ratios of read and write operations can be increased to improve the I/O bus occupation rate (data transmission rate).

Figure 22:
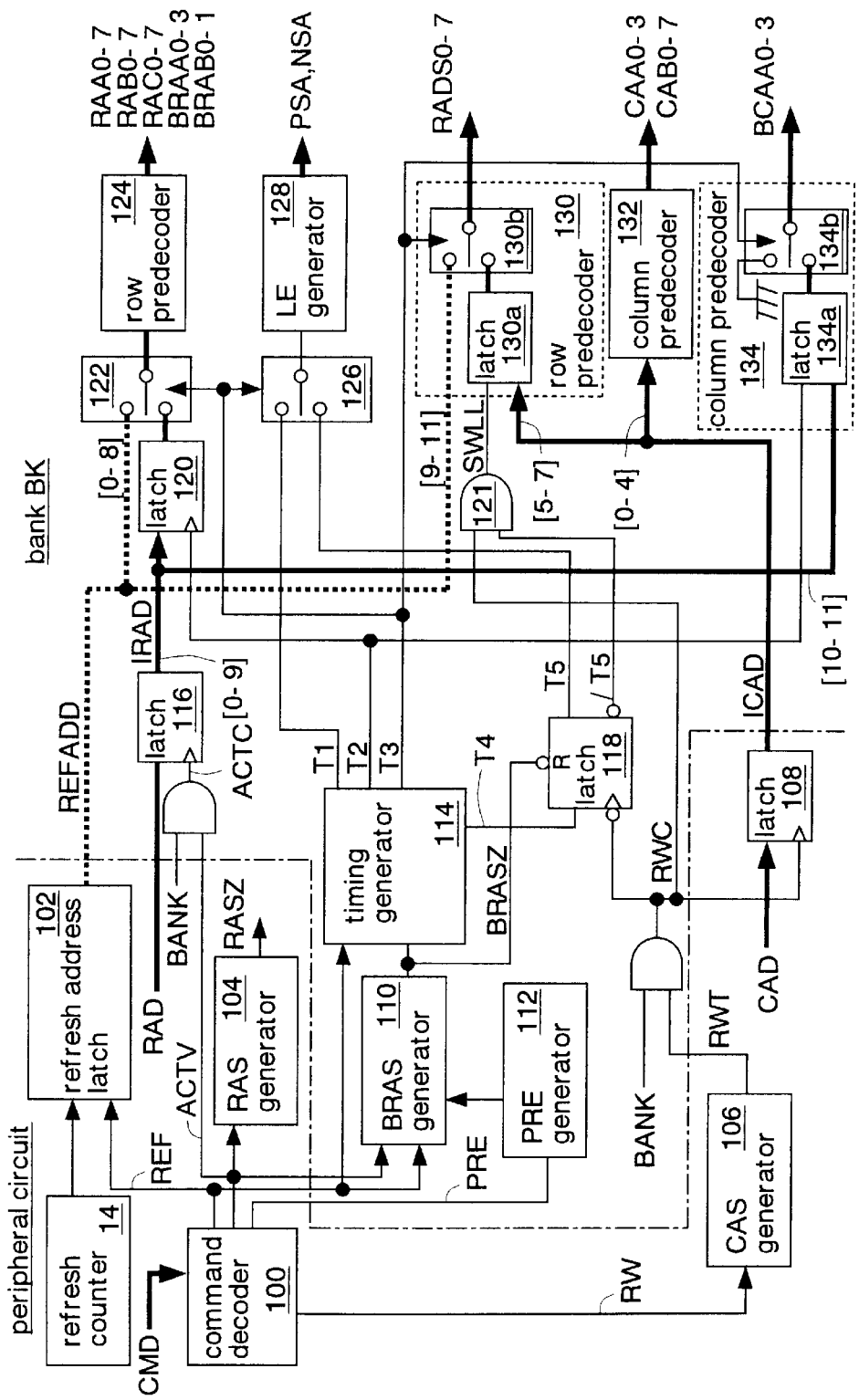
FIG. 22 is a block diagram showing a seventh embodiment of the present invention.

FIG. 22 shows a seventh embodiment of the semiconductor memory and the method of operating a semiconductor memory in the present invention. The same circuits and signals as those described in the first and sixth embodiments will be designated by identical reference numbers or symbols. Detailed description of these circuits and signals will be omitted here.

In FIG. 22, memory cores are omitted. The semiconductor is constituted as an SDRAM, the basic operations of which are the same as those of the foregoing sixth embodiment except that refresh operations are performed in accordance with refresh commands from exterior.

The SDRAM has a peripheral circuit and a bank BK to be laid out on the periphery of a memory core (the outer periphery or central portion of the chip). The memory core in the bank BK is omitted from the diagram. The dashed line in the diagram indicates the boundary between the peripheral circuit and the bank BK.

The peripheral circuit includes a refresh counter 14, a command decoder 100, a refresh address latch 102, an RAS generator 104, a CAS generator 106, and a latch 108.

The command decoder 100 generates a refresh command signal REF, an active command signal ACTV, a precharge command signal PRE, and a read/write command signal RW in accordance with a command signal CMD which is supplied from exterior. The refresh address latch 102 outputs a refresh address received from the refresh counter 14 as a refresh address signal REFAD in accordance with the refresh command signal REF.

The RAS generator 104 outputs, in accordance with the active command signal ACTV, a timing signal RASZ for controlling circuits corresponding to a row address signal RAD. The CAS generator 106 outputs, in accordance with a read command RD and a write command WR, a read/write timing signal RWT for controlling a read operation and a write operation. The latch 108 latches a column address signal CAD in synchronization with the AND logic (operation control signal RWC) of a bank signal BANK and the read/write timing signal RWT.

The bank BK includes a BRAS generator 110, a PRE generator 112, a timing generator 114, latches 116, 118, and 120, an AND gate 121, a switch 122, a row predecoder 124, a switch 126, an SA generator 128, a row predecoder 130, and column predecoders 132 and 134. The latch 118 and the AND gate 121 function as an activation control circuit for activating the row predecoder 130 in response to only the first read command RD (or write command WR) that follows an active command ACT.

The BRAS generator 110 activates a basic timing signal BRASZ in accordance with the refresh command REF and the read/write command signal RW, and inactivates the basic timing signal BRASZ in accordance with the precharge command signal PRE. The PRE generator 112 outputs a timing signal to the BRAS generator 110 in accordance with the precharge command signal PRE.

The timing generator 114 generates timing signals T1, T2, T3, and T4 in accordance with the basic timing signal BRASZ. The latch 116 latches the row address signal RAD in synchronization with the AND logic (operation control signal ACTC) of the bank signal BANK and the active command signal ACTV, and outputs the resultant as an internal row address signal IRAD.

The latch 118 latches the timing signal T4 in synchronization with the falling edge of the operation control signal RWC, which is the AND logic of the bank signal BANK and the read/write timing signal RWT, and outputs the resultant as complementary timing signals TS and /T5. The latch 118 is reset when the basic timing signal BRASZ is at low level. Here, the basic timing signal BRASZ is activated from the supply of the active command ACT to the supply of the precharge command PRE (operation completion command). The latch 118 latches the level of the basic timing signal BRASZ each time the read command RD (or write command WR) is supplied.

The latch 120 latches the internal row address signal IRAD in synchronization with the rising edge of the timing signal T2, and outputs the resultant to the switch 122. The switch 122 selects the internal row address signal IRAD and the refresh address signal when the timing signal T3 is at low level and high level, respectively. The row predecoder 124 decodes the address signal transmitted from the switch 122, and outputs decoding signals RAA0–7, RAB0–7, and RAC0–1 for selecting main-word lines MWL, and decoding signals BRAA0–3 and BRAB0–1 for selecting memory blocks MBLK. The decoding signals RAA0–7, RAB0–7, RAC0–1, BRAA0–3, and BRAB0–1 are signals generated from the internal address signal IRAD0–2, IRAD3–5, IRAD6, IRAD7–8, and IRAD9 shown in FIG. 18, respectively.

The latch 126 selects the timing signal T1 in refresh operations, and the timing signal T5 in read and write operations. The SA generator 128 receives the output of the switch 126, and generates activation signals PSA and NSA for sense amplifiers SA.

The AND gate 121 outputs the operation control signal RWC as a sub-word latched signal SWLL when the timing signal /T5 is at high level. That is, the operation control signal RWC is gated by an output of the latch 118 (timing signal /T5). The timing signal /T5, as will be described later, remains at high level only when the first read command RD (or write command WR) is supplied after the supply of the active command ACT. It changes to low level by the time when the second read command RD (or write command WR) is supplied.

The row predecoder 130 has a latch 130a and a switch 130b. The latch 130a latches an internal column address signal ICAD in synchronization with the sub-word latched signal SWLL. The switch 130b selects the internal column address ICAD when the timing signal T3 is at low level, and selects the refresh address signal REFAD when the timing signal T3 is at high level. The switch 130b decodes the selected signal in a not-shown decoding circuit, and outputs the resultant as a decoding signal RADS0–7. The decoding signal RADS0–7 is a signal generated from ICAD5–7 (in read and write operations) or IRAD9–11 (in refresh operations) shown in FIG. 18.

The column predecoder 132 decodes the internal column address signal ICAD, and outputs decoding signals CAA0–3 and CAB0–7. The decoding signals CAA0–3 and CAB0–7 are signals generated from the internal row addresses ICAD0–1 and ICAD3–6 shown in FIG. 18, respectively.

The column predecoder 134 has a latch 134a and a switch 134b. The latch 134a latches the internal row address signal IRAD in synchronization with the timing signal T2. The switch 134b outputs a low level in refresh operations. In read and write operations, the switch 134b selects the internal row address signal IRAD10–11, decodes the selected signal in a not-shown decoding circuit, and outputs the resultant as a decoding signal BCAA0–3.

Figure 23:
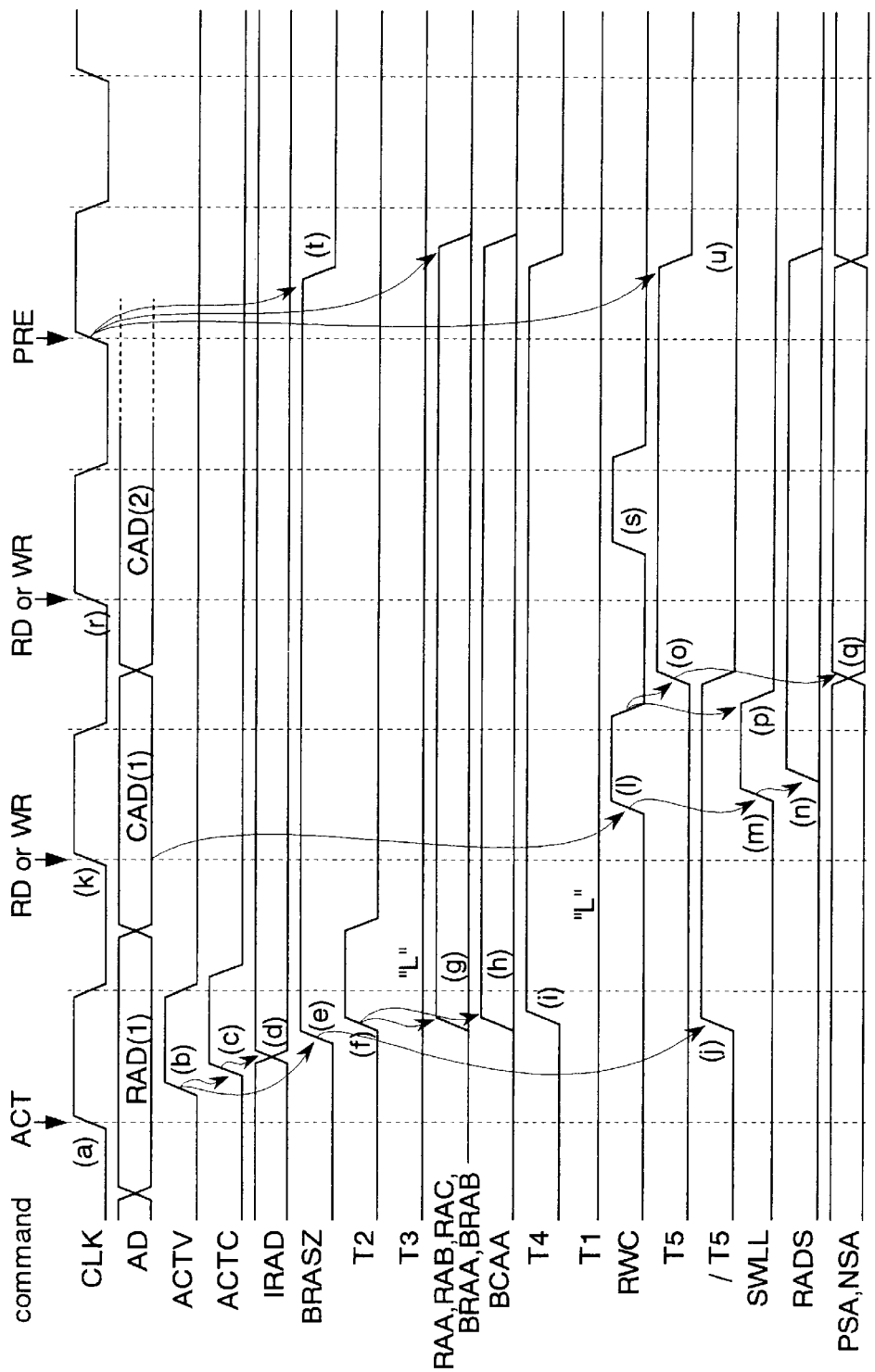
FIG. 23 is a timing chart showing the operations of the SDRAM in the seventh embodiment.

FIG. 23 shows read operations of the SDRAM described above. In this example, as in FIG. 20 described above, two read commands RD (or write commands WR) are supplied in succession after the active command ACT. Then, the precharge command PRE is supplied. Since the generation timing of the main-word lines MWL, the sub-word lines SWL, the bit line transfer signals MBT and SBT, and the bit line reset signals MBRS and SBRS is the same as in FIG. 20, description thereof will be omitted. FIG. 23 provides detailed description up to the generation of the decoding signals to be supplied to the memory cores.

Initially, the active command ACT is supplied in synchronization with the clock signal CLK (FIG. 23(a)). The command decoder 100 shown in FIG. 22 activates the active command signal ACTV in accordance with the active command ACT (FIG. 23(b)). The activation of the active command signal ACTV also activates the operation control signal ACTC (FIG. 23(c)). The latch 116 shown in FIG. 22 latches a row address signal RAD(1) in synchronization with the operation control signal ACTC, and outputs the resultant as the internal row address signal IRAD (FIG. 23(d)).

The BRAS generator 110 activates the basic timing signal BRASZ in response to the active command signal ACTV (FIG. 23(e)). The timing generator 114 activates the timing signal T2 in synchronization with the rising edge of the basic timing signal BRASZ (FIG. 23(f)). The latch 116 latches the internal row address signal IRAD0–11 in synchronization with the rising edge of the timing signal T2. The switch 122 receives the timing signal T3 of low level, and transmits the internal row address signal IRAD0–9 to the row predecoder 124. The row predecoder 124 decodes the internal row address signal IRAD0–9, and outputs any of the decoding signals RAA0–7, RAB0–7, RAC0–7, BRAA0–3, and BRAB0–1 (FIG. 23(g)). The activation of the decoding signals RAA0–7, RAB0–7, RAC0–7, BRAA0–3, and BRAB0–1 selects main-word lines MWL, the bit line transfer signal MBTL, and the bit line reset signals MBRS as in the sixth embodiment.

The column predecoder 134 receives the row address signal IRAD10–11 in synchronization with the rising edge of the timing signal T2, decodes the received signal, and outputs any of the decoding signal BCAA0–3 (FIG. 23(h)). The activation of the decoding signal BCAA0–3 selects the bit line transfer signal SBTL and the bit line reset signals SBRS as in the sixth embodiment. That is, the row address signal RAD supplied along with the active command ACT releases the precharge of bit lines BL, /BL and establishes connection between a memory block MBLK and sense amplifiers SA.

The timing generator 114 activates the timing signal T4 with a predetermined time of delay after the rising edge of the basic timing signal BRASZ (FIG. 23(i)). The high level of the basic timing signal BRASZ releases the latch 118 from a reset state, turning the timing signals T5 and /T5 to low level and high level, respectively (FIG. 23(j)).

A read command RD (or write command WR) is supplied in synchronization with the next clock signal CLK (FIG. 23(k)). The command decoder 100 activates the read/write command signal RW in accordance with the read command RD. The CAS generator 106 activates the read/write timing signal RWT in response to the read/write command signal RW. The activation of the read/write timing signal RWT activates the operation control signal RWC for a predetermined period (FIG. 23(l)).

The latch 108 latches the column address signal CAD in synchronization with the rising edge of the operation control signal RWC, and outputs the resultant as the internal column address signal ICAD0–7 (not shown). The high levels of the timing signal /T5 and the operation control signal RWC activate the sub-word latched signal SWLL for a predetermined period (FIG. 23(m)). The row predecoder 130 latches the internal column address signal ICAD5–7 in synchronization with the rising edge of the sub-word latched signal SWLL, and outputs any of the decoding signal RADS0–7 (FIG. 23(n)). The decoding signal RADS0–7 selects sub-word lines SWL as in the sixth embodiment. That is, the sub-word lines SWL are selected by the column address signal CAD that is supplied along with the read command RD (or write command WD). Then, read data is output from the memory cells MC to the sense amplifiers SA.

The latch 118 latches the high level of the timing signal T4 in synchronization with the falling edge of the operation control signal RWC, and turns the timing signals T5 and /T5 to high level and low level, respectively (FIG. 23(o)). The timing signal T4 remains at high level over the active period. Therefore, the timing signal /T5 remains at low level until the basic timing signal BRASZ is turned to low level. The low level of the operation control signal RWC also changes the sub-word latched signal SWLL to low level (FIG. 23(p)). The switch 126 transmits the timing signal T5 of high level to the SA generator 128. The SA generator 128 receives the timing signal T5 of high level, and activates the activation signals PSA and NSA (FIG. 23(q)). Then, sense amplifiers SA operate to amplify the read data on the bit lines BL (or /BL). The column predecoder 132 receives the internal column address ICAD0–4, and outputs any of the decoding signals CAA0–3 and CAB0–7 (not shown). Then, the read data is output.

A read command RD (or write command WR) is supplied in synchronization with the next clock signal CLK (FIG. 23(r)). The command decoder 100 activates the read/write command signal RW in accordance with the read command RD. The CAS generator 106 activates the read/write timing signal RWT in response to the read/write command signal RW. The activation of the read/write timing signal RWT activates the operation control signal RWC for a predetermined period (FIG. 23(s)). The latch 108 latches the column address signal CAD in synchronization with the rising edge of the operation control signal RWC, and outputs the resultant as the internal column address signal ICAD0–7 (not shown).

Since the timing signal T5 is at low level, the sub-word latched signal SWLL will not activated in response to the activation of the operation control signal RWC. This precludes the operation of the row predecoder 130. Thus, the sub-word lines SWL are selected only by the read command RD (or write command WR) that is supplied next to the active command ACT.

The precharge command PRE is supplied in synchronization with the next clock signal CLK, turning the basic timing signal BRASZ to low level (FIG. 23(t)). The latch 118 is reset by the basic timing signal BRASZ of low level, thereby turning the timing signals T5 and /T5 both to low level (FIG. 23(u)). Then, the decoding signals RAA, RAB, RAC, BRAA, BRAB, RADS, CAA, CAB, and BCAA, and the activation signals PSA and NSA are inactivated to put the memory blocks MBLK into an idle state.

Although not shown in FIG. 23, the timing generator 114 activates the timing signals T1 and T3 in a refresh operation. In accordance with the activation of the timing signal T3, the switches 122, 126, 130b, and 134b select the refresh address REFAD0–8, the timing signal T1, the refresh address REFAD9–11, and the ground voltage, respectively. Then, the refresh operation is performed.

As has been described, this embodiment can offer the same effects as those obtained from the first and sixth embodiments described above. Moreover, in this embodiment, the row predecoder 130 which generates the decoding signal for selecting sub-word lines SWL is operated only by the first read command RD (or write command WR) after the active command ACT. Among the column address signals CAD that are supplied along with the second and subsequent read commands RD (or write commands WR), the column address signals CAD5–7 for selecting sub-word lines SWL are ignored. This can surely prevent the SDRAM from malfunctions such as multiple selection of word lines. Because of not operating in response to the subsequent read commands RD (or write commands WR), the row predecoder 130 can be reduced in power consumption.

Figure 24:
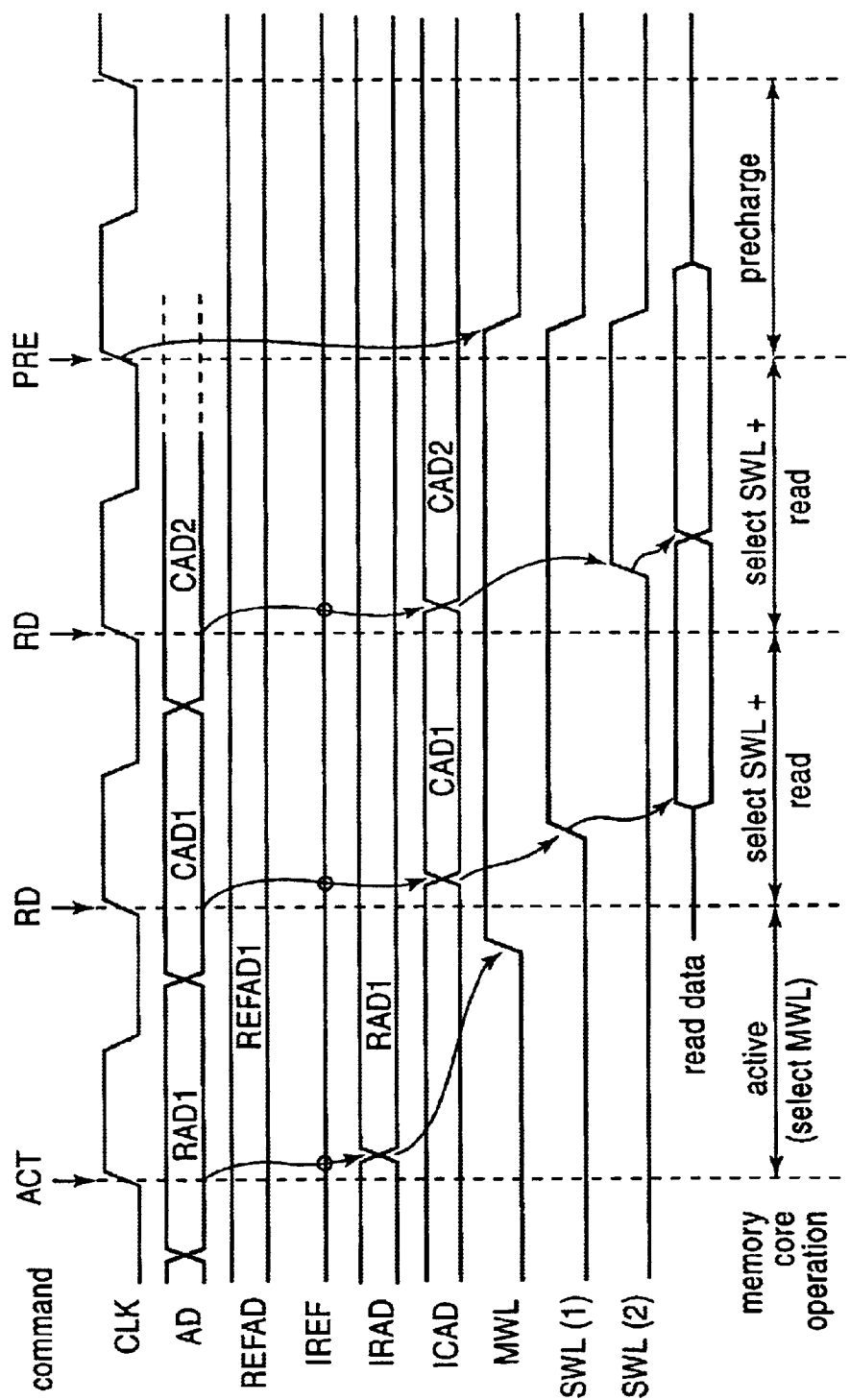
FIG. 24 is a timing chart showing read operations of the present invention.

Incidentally, the first embodiment described above has dealt with the case where the sub-word lines SWL are activated each time the read command RD is supplied, and the main-word lines MWL are kept activated until the precharge command PRE is supplied. However, the present invention is not limited to such an embodiment. For example, as shown in FIG. 24, the main-word lines MWL and the sub-word lines SWL both may be kept activated until the supply of the precharge command PRE. Performing page operations without inactivating the sub-word lines SWL allows a further reduction of power consumption during operation.

The embodiments described above have dealt with the operating timing in read operations. However, the present invention is not limited to such embodiments. For example, write operations can be performed in the same timing as that of the read operations.

The above-described embodiments have dealt with the cases where a no-read-operation period is utilized to perform a refresh operation. However, the present invention is not limited to such embodiments. For example, this period may be used to perform a self test or the like inside the chip. Based on the result of the self test, control signal timing or a control voltage may be adjusted to operate the semiconductor memory at optimum timing in accordance with voltage variations and/or temperature variations.

The above-described embodiments have dealt with the cases where the present invention is applied to an SDRAM. The present invention is not limited thereto, and may be applied to such semiconductor memories as a DRAM or an SRAM. The present invention may also be applied to system LSIs that implement DRAM memory cores.

The invention is not limited to the above embodiments and various modifications may be made without departing from the spirit and the scope of the invention. Any improvement may be made in part or all of the components.

What is claimed is:

1. A semiconductor memory for receiving a plurality of commands in succession and performing a memory operation to read/write data from/to memory cells in accordance with the combination of said commands, said semiconductor memory comprising a word line connected to transfer switches of said memory cells, which is activated after the reception of a second command which is supplied after a first command which starts memory access, the first and second commands being included in said plurality of commands, wherein:

said word line is one of a plurality of sub-word lines being connected to said transfer switches of said memory cells;

said sub-word lines are connected to a common main-word line;

said main-word line is activated during a plurality of said memory operations; and one of said sub-word lines is activated upon each of said memory operations.

2. The semiconductor memory according to claim 1, wherein:

a refresh occurring circuit for generating at predetermined intervals a refresh request for refreshing said memory cells;

a buffer for holding said refresh request; and a refresh control circuit for performing a refresh operation based on said refresh request held by said buffer when said memory operation is not in execution.

3. The semiconductor memory according to claim 2, wherein:
said commands are supplied in synchronization with a clock signal; and
said refresh control circuit performs a refresh operation in synchronization with said clock signal which is supplied when said memory operation is not in execution.

4. A semiconductor memory receiving a plurality of commands in succession and performing a memory operation to read/write data from/to memory cells in accordance with the combination of said commands, said semiconductor memory comprising
a word line connected to transfer switches of said memory cells, which is activated after the reception of a second command which is supplied after a first command which starts memory access, the first and second commands being included in said plurality of commands, wherein:
said word line is one of a plurality of sub-word lines being connected to said transfer switches of said memory cells;
said sub-word lines are connected to a common main-word line; and said main-word line and said sub-word lines are activated during a plurality of said memory operations.

5. The semiconductor memory according to claim 4, wherein:
a refresh occurring circuit for generating at predetermined intervals a refresh request for refreshing said memory cells;
a buffer for holding said refresh request; and
a refresh control circuit for performing a refresh operation based on said refresh request held by said buffer when said memory operation is not in execution.

6. The semiconductor memory according to claim 5, wherein:
said commands are supplied in synchronization with a clock signal; and
said refresh control circuit performs a refresh operation in synchronization with said clock signal which is supplied when said memory operation is not in execution.

7. A semiconductor memory for receiving a plurality of commands in succession and performing a memory operation to read/write data from/to memory cells in accordance with the combination of said commands, said semiconductor memory comprising
a word line connected to transfer switches of said memory cells, which is activated after the reception of a second command which is supplied after a first command which starts memory access, the first and second commands being included in said plurality of commands, wherein:
said word line is one of a plurality of sub-word lines being connected to said transfer switches of said memory cells;
said sub-word lines are connected to a common main-word line; and,
in read and write operations,
said main-word line is activated in accordance with an address signal supplied along with said first command and
said sub-word lines are activated in accordance with an address signal supplied along with at least one of said commands except the first command.

8. The semiconductor memory according to claim 7, further comprising:
a plurality of bit lines respectively connected to sia dmemory cells connected to said sub-word lines; and
a precharging circuit for setting said bit lines to a predetermined voltage, and wherein
said precharging circuit releases a part of said bit lines form a precharge operation in accordance with said address signal supplied along with the first command.

9. The semiconductor memory according to claim 8, further comprising a plurality of memory blocks having said memory cells, and wherein:
each of said memory blocks is composed of a plurality of segments; and
said precharing circuit releases said bit lines form a precharge operation on a segment basis.

10. The semiconductor memory according to claim 7, comprising a plurality of memory blocks having said memory cells, and wherein
one of said memory blocks is selected in accordance with said address signal supplied along with said first command.

11. The semiconductor memory according to claim 10, comprising:
a plurality of bit lines respectively connected to said memory cells connected to said sub-word lines;
a plurality of sense amplifiers formed commonly for a pair of said memory blocks, for amplifying data on said bit lines within said memory blocks; and
a plurality of bit line selecting switches for establishing connections between said bit lines of said each memory block and said sense amplifiers, respectively, and wherein:
said memory blocks are composed of a plurality of segments; and
said bit line selecting switches are selected on a segment basis, in accordance with said address signal supplied along with the first command.

12. The semiconductor memory according to claim 11, wherein
said memory cells are volatile; and
a refresh operation for rewriting data retained in said memory cells is performed by selecting said bit line selecting switches in said plurality of segments at once.

13. The semiconductor memory according to claim 7, comprising:
a decoder for generating a decoding signal for selecting one of said sub-word lines in accordance with said address signals; and
an activation control circuit for activating said decoder in response to only the second command.

14. The semiconductor memory according to claim 13, wherein
said activation control circuit comprises:
a latch for latching the level of a basic timing signal in synchronization with one of said commands except the first command, said basic timing signal being activated from the supply of the first command to the supply of an operation completion command; and
a logic gate for gating an operation control signal to be activated in response to one of said commands except the first command, with an output of said latch.

15. the semiconductor memory according to claim 7, wherein
said memory cells are volatile; and in a refresh operation for rewriting data retained in said memory cells, said main-word line and said sub-word lines are selected in accordance with said address signal corresponding to the first command.

16. The semiconductor memory according to claim 7, wherein:

a refresh occurring circuit for generating at predetermined intervals a refresh request for refreshing said memory cells;

a buffer for holding said refresh request; and a refresh control circuit for performing a refresh operation based on said refresh request held by said buffer when said memory operation is not in execution.

17. The semiconductor memory according to claim 6, wherein:

said commands are supplied in synchronization with a clock signal; and said refresh control circuit performs a refresh operation in synchronization with said clock signal which is supplied when said memory operation is not in execution.

18. A semiconductor memory for receiving a plurality of commands in succession and performing a memory operation to read/write data from/to memory cells in accordance with the combination of said commands, said semiconductor memory comprising a word line connected to transfer switches of said memory cells, which is activated after the reception of a second command which is supplied after a first command which starts memory access, the first and second commands being included in said plurality of commands, wherein:

a refresh occurring circuit for generating at predetermined intervals a refresh request for refreshing said memory cells;

a plurality of buffers for holding refresh requests alternately by holding a succeeding refresh request generated before a refresh operation is performed in response to a preceding refresh request; and a refresh control circuit for performing a refresh operation based on one of said refresh requests held by at least one of said buffers when said memory operation is not in execution.

\* \* \* \* \*